(12) United States Patent
Park et al.

(10) Patent No.: US 11,646,398 B2
(45) Date of Patent: May 9, 2023

(54) SEMICONDUCTOR LIGHT EMITTING DEVICE

(71) Applicant: SAMSUNG ELECTRONICS CO., LTD., Suwon-si (KR)

(72) Inventors: Kiwon Park, Suwon-si (KR);
Namsung Kim, Hwaseong-si (KR);
Youngsub Shin, Hwaseong-si (KR);
Jonghyun Lee, Suwon-si (KR);
Daemyung Chun, Hwaseong-si (KR);
Byungchul Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 17/323,042

(22) Filed: May 18, 2021

(65) Prior Publication Data

US 2022/0085257 A1     Mar. 17, 2022

(30) Foreign Application Priority Data

Sep. 11, 2020     (KR) ........................ 10-2020-0116837

(51) Int. Cl.
*H01L 33/50*      (2010.01)
*H01L 33/46*      (2010.01)
(Continued)

(52) U.S. Cl.
CPC ............ *H01L 33/505* (2013.01); *H01L 27/15* (2013.01); *H01L 33/007* (2013.01);
(Continued)

(58) Field of Classification Search
CPC . H01L 33/505; H01L 33/0093; H01L 33/007; H01L 33/382; H01L 33/46;
(Continued)

(56) References Cited

U.S. PATENT DOCUMENTS 6,372,608 B1    4/2002   Shimoda et al.
6,645,830 B2    11/2003  Shimoda et al.
(Continued)

FOREIGN PATENT DOCUMENTS

KR    10-2012-0084839 A    7/2012

*Primary Examiner* — Mark W Tornow
(74) *Attorney, Agent, or Firm* — Lee IP Law, P.C.

(57) ABSTRACT

A semiconductor light emitting device including a semiconductor laminate having first and second surfaces, the semiconductor laminate including first and second conductivity-type semiconductor layers, and an active layer between the semiconductor layers; a partition structure on the first surface, the partition structure having a window defining a light emitting region of the first surface of the semiconductor laminate; a wavelength converter in the window, the wavelength converter being configured to convert a wavelength of light emitted from the active layer; and a first electrode and a second electrode on the second surface of the semiconductor laminate and respectively connected to the first conductivity-type semiconductor layer and the second conductivity-type semiconductor layer, wherein the semiconductor laminate includes a plurality of first patterns arranged in the light emitting region of the first surface, and a plurality of second patterns arranged in a covered region of the first surface contacting the partition structure.

20 Claims, 28 Drawing Sheets

(51) Int. Cl.
    *H01L 33/38*     (2010.01)
    *H01L 27/15*     (2006.01)
    *H01L 33/00*     (2010.01)

(52) U.S. Cl.
    CPC ........ *H01L 33/0093* (2020.05); *H01L 33/382* (2013.01); *H01L 33/46* (2013.01); *H01L 2933/0016* (2013.01); *H01L 2933/0025* (2013.01); *H01L 2933/0041* (2013.01)

(58) Field of Classification Search
    CPC ............. H01L 27/15; H01L 2933/0016; H01L 2933/0025; H01L 2933/0041
    See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,977,695 B2 | 7/2011 | Shim et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,887,332 B2 | 2/2018 | Choi et al. |
| 9,905,543 B2 | 2/2018 | Yeon et al. |
| 10,069,038 B2 | 9/2018 | Kim et al. |
| 10,438,994 B2 | 10/2019 | Yeon et al. |
| 10,573,632 B2 | 2/2020 | Yeon et al. |
| 2017/0250316 A1* | 8/2017 | Yeon | H01L 33/504 |
| 2019/0181181 A1* | 6/2019 | Yeon | H01L 33/22 |
| 2020/0279979 A1* | 9/2020 | Lee | H01L 33/62 |
| 2022/0013692 A1* | 1/2022 | Chen | H01L 33/44 |
| 2022/0069182 A1* | 3/2022 | Iguchi | H01L 33/60 |

\* cited by examiner

SEMICONDUCTOR LIGHT EMITTING DEVICE

CROSS-REFERENCE TO RELATED APPLICATION

Korean Patent Application No. 10-2020-0116837, filed on Sep. 11, 2020, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

A light emitting diode (LED), a type of semiconductor light emitting device, has advantages such as a long lifespan, low power consumption, fast response speeds, environmental friendliness, and the like, to be widely used as a light source in various products such as light sources for lighting devices, display devices, and the like.

SUMMARY

The embodiments may be realized by providing a semiconductor light emitting device including at least one semiconductor laminate having a first surface and a second surface, opposing each other, the at least one semiconductor laminate including a first conductivity-type semiconductor layer, a second conductivity-type semiconductor layer, and an active layer between the first conductivity-type semiconductor layer and the second conductivity-type semiconductor layer; a partition structure on the first surface of the at least one semiconductor laminate, the partition structure having a window defining a light emitting region of the first surface of the at least one semiconductor laminate; a wavelength converter in the window, the wavelength converter being configured to convert a wavelength of light emitted from the active layer; and at least one first electrode and at least one second electrode on the second surface of the at least one semiconductor laminate and respectively connected to the first conductivity-type semiconductor layer and the second conductivity-type semiconductor layer, wherein the at least one semiconductor laminate includes a plurality of first patterns arranged in the light emitting region of the first surface, and a plurality of second patterns arranged in a covered region of the first surface contacting the partition structure.

The embodiments may be realized by providing a semiconductor light emitting device including a cell array including a plurality of LED cells, each LED cell respectively having a first conductivity-type semiconductor layer, a second conductivity-type semiconductor layer, and an active layer between the first conductivity-type semiconductor layer and the second conductivity-type semiconductor layer, being separated from each other, and having a first surface and a second surface opposing the first surface; a reflective insulating portion between the plurality of LED cells such that the plurality of LED cells are optically blocked from each other; a partition structure on the first surface of the cell array and connected to the reflective insulating portion, the partition structure having a plurality of windows respectively corresponding to the plurality of LED cells; at least one wavelength conversion layer in at least one window of the plurality of windows, the at least one wavelength conversion layer converting a wavelength of light generated by the active layer; and a first electrode and a second electrode on the second surface of the cell array and electrically connected to the plurality of LED cells, respectively, wherein the first surface of the cell array includes a plurality of first regions corresponding to the plurality of windows and in which a plurality of first patterns are arranged, and a second region contacting the partition structure and in which a plurality of second patterns are arranged.

The embodiments may be realized by providing a semiconductor light emitting device including a semiconductor laminate having a first surface and a second surface, opposing each other, the semiconductor laminate including a first conductivity-type semiconductor layer, a second conductivity-type semiconductor layer, and an active layer between the first conductivity-type semiconductor layer and the second conductivity-type semiconductor layer; a partition structure on the first surface of the semiconductor laminate and having a window defining a light emitting region of the first surface of the semiconductor laminate; a wavelength converter in the window, the wavelength converter being configured to convert a wavelength of light emitted from the active layer; and a first electrode and a second electrode on the second surface of the semiconductor laminate and respectively connected to the first conductivity-type semiconductor layer and the second conductivity-type semiconductor layer, wherein the semiconductor laminate has a substantially uniform shape in the light emitting region of the first surface, and has a plurality of light extraction patterns arranged at a regular interval.

BRIEF DESCRIPTION OF DRAWINGS

Features will be apparent to those of skill in the art by describing in detail exemplary embodiments with reference to the attached drawings in which.

DETAILED DESCRIPTION

Figure 1:
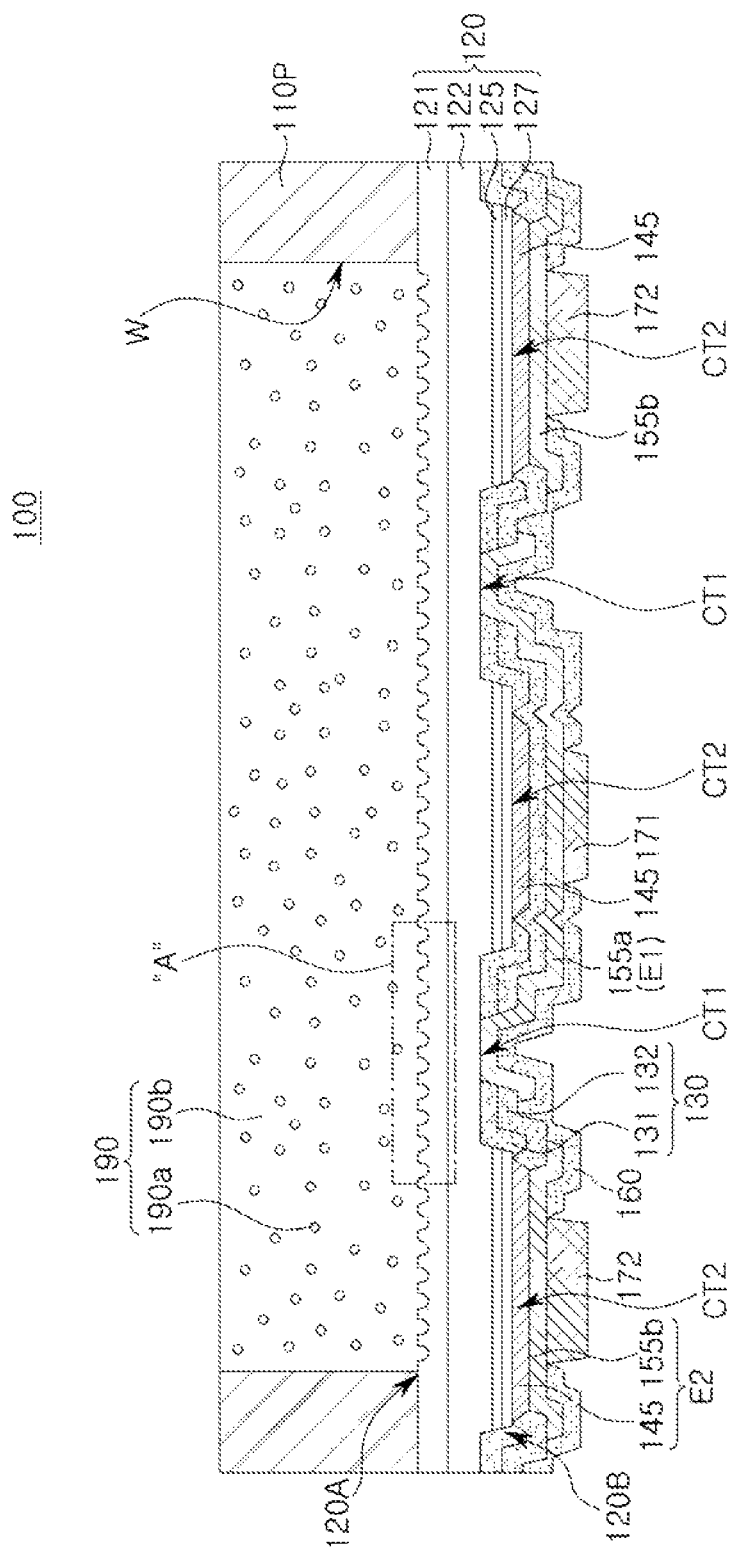
FIG. 1 is a side cross-sectional view of a semiconductor light emitting device according to an embodiment.

FIG. 1 is a side cross-sectional view of a semiconductor light emitting device according to an embodiment.

Referring to FIG. 1, a semiconductor light emitting device 100 according to this embodiment may include a semiconductor laminate 120 having a first surface 120A and a second surface 120B, opposing each other, a partition structure 110P on the first surface 120A of the semiconductor laminate 120, and a first electrode E1 and a second electrode E2, on the second surface 120B of the semiconductor laminate 120.

The semiconductor laminate 120 may include a first conductivity-type semiconductor layer 122, a second conductivity-type semiconductor layer 127, and an active layer 125 between the first and second conductivity-type semiconductor layers 122 and 127. The semiconductor laminate 120 employed in this embodiment may include an undoped semiconductor layer 121 on the first conductivity-type semiconductor layer 122 and providing (e.g., at) the first surface 120A.

The first surface 120A of the semiconductor laminate 120 may have a textured surface. In an implementation, the textured surface may be on the undoped semiconductor layer 121. In an implementation, the textured surface may include a plurality of patterns LP on the first surface 120A. The plurality of patterns LP may be a light extraction pattern for improving light extraction efficiency of the semiconductor light emitting device 100. The plurality of patterns LP may help to smoothly extract light generated by the active layer 125 from the semiconductor laminate 120 having a relatively high refractive index.

Figure 3A:
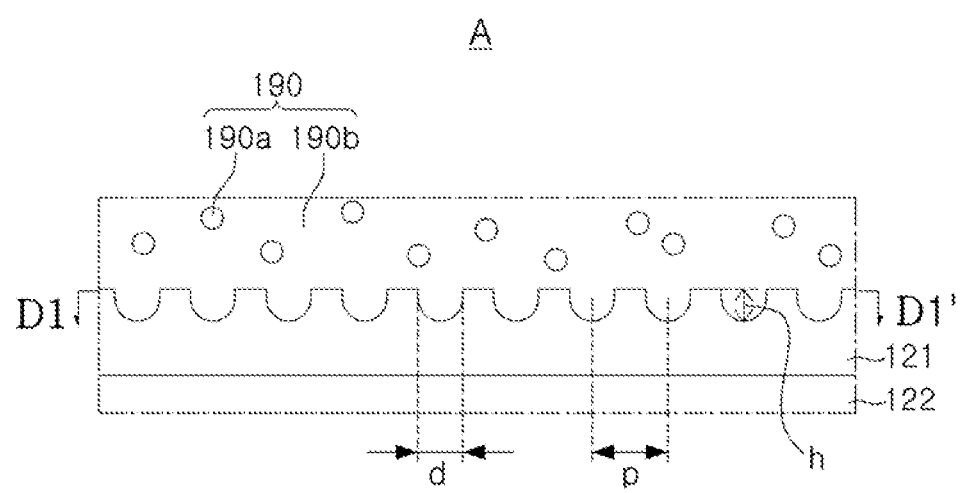
FIG. 3A is a partially enlarged view of portion "A" of the semiconductor light emitting device illustrated in FIG. 1.
Figure 3B:
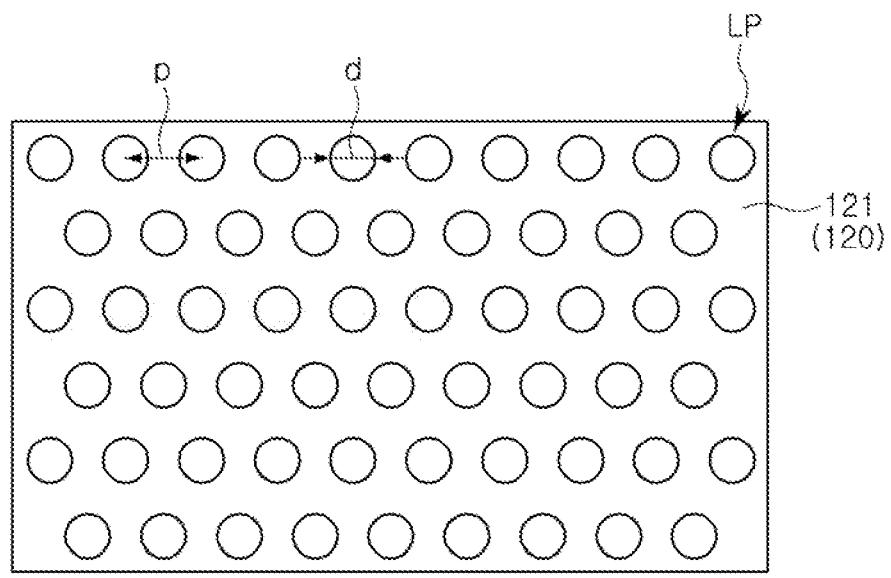
FIG. 3B is a plan view of the portion of FIG. 3A, taken along line D1-D1'.

The plurality of patterns LP may have a non-planar structure. In an implementation, the non-planar structure may be a concave structure or a convex structure. The plurality of patterns LP employed in this embodiment may have an arrangement having regularity. In an implementation, the plurality of patterns LP may have substantially the same shapes, repeatedly arranged. Referring to FIGS. 3A and 3B, each of the patterns LP may have a substantially hemispherical concave structure, and may be arranged to have a constant pitch p. In addition to the shapes of the plurality of patterns LP, a size of the plurality of patterns LP, e.g., a width d and a height h of the plurality of patterns LP may be substantially the same. In an implementation, the shape and arrangement of the plurality of patterns LP may be variously changed (see FIGS. 8B and 9B).

Figure 7A:
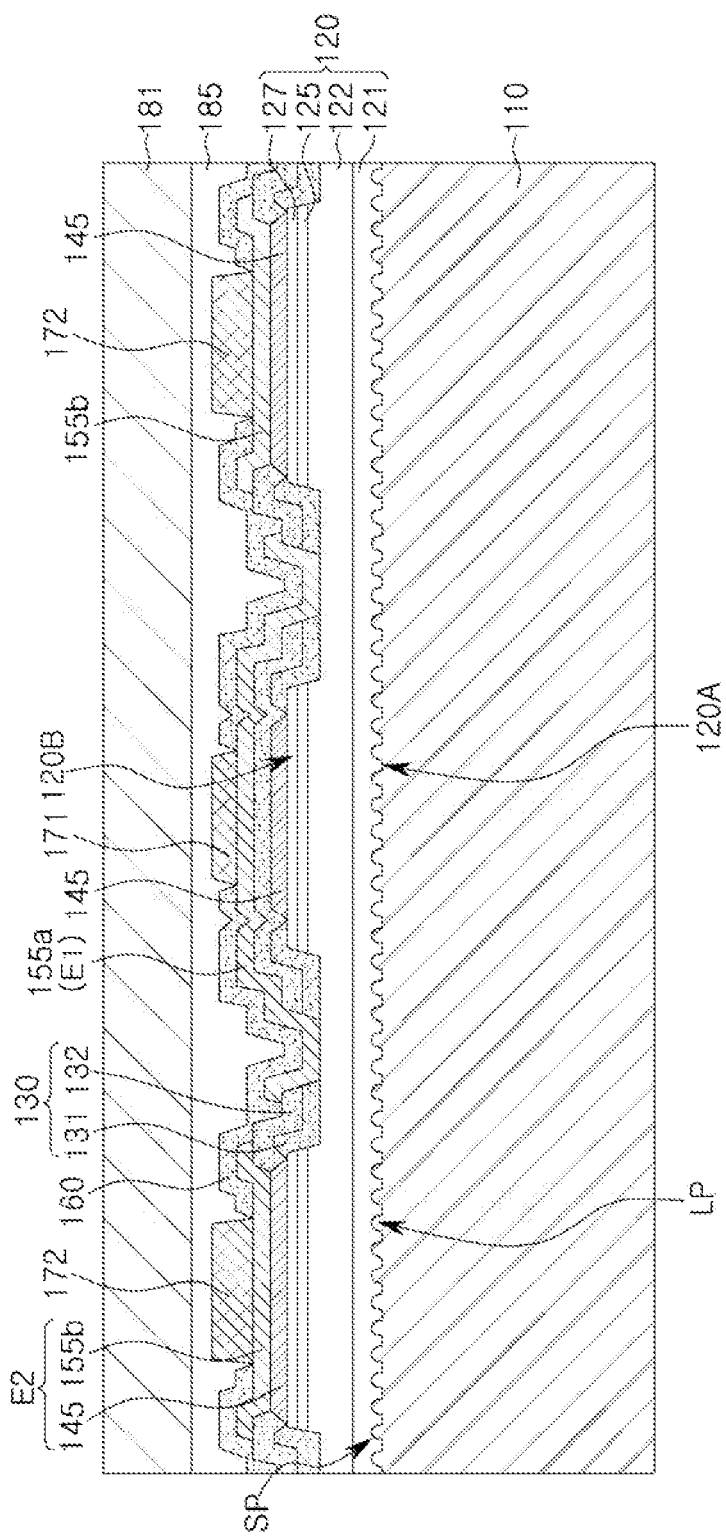
FIGS. 7A to 7D are cross-sectional views of stages in a method of manufacturing a semiconductor light emitting device according to an embodiment.

The plurality of patterns LP may be a pattern obtained by transferring from a pattern previously formed on a growth surface of a growth substrate, and the growth surface of the growth substrate may be formed to have a predetermined pattern (see FIG. 7A). In an implementation, patterning of the growth substrate may be performed by a texture process using a photoresist and dry etching. Unlike a wet etching process, this process may help ensure uniform pattern formation not only on an entire region of a wafer (e.g., the growth substrate) but also on the other wafer. As a result, a plurality of patterns LP of the semiconductor laminate 120 obtained by transferring the pattern of the growth substrate may also have a uniform pattern, and reproducibility may be greatly improved.

The partition structure 110P may have a window W defining a light emitting region of the first surface 120A. The semiconductor light emitting device 100 may further include a wavelength converter 190 in the window W. The wavelength converter 190 may be configured to convert a wavelength of light emitted from the active layer 125. The partition structure 110P may be a portion of the growth substrate. In an implementation, the partition structure 110P may be a portion of a growth substrate having a light blocking function, e.g., a silicon substrate. In an implementation, after removing the growth substrate, the partition structure 110P may include a resin body in which a light blocking material such as a black matrix, or a light reflective powder (e.g., a white ceramic powder or a reflective metal powder) is dispersed.

Figure 2:
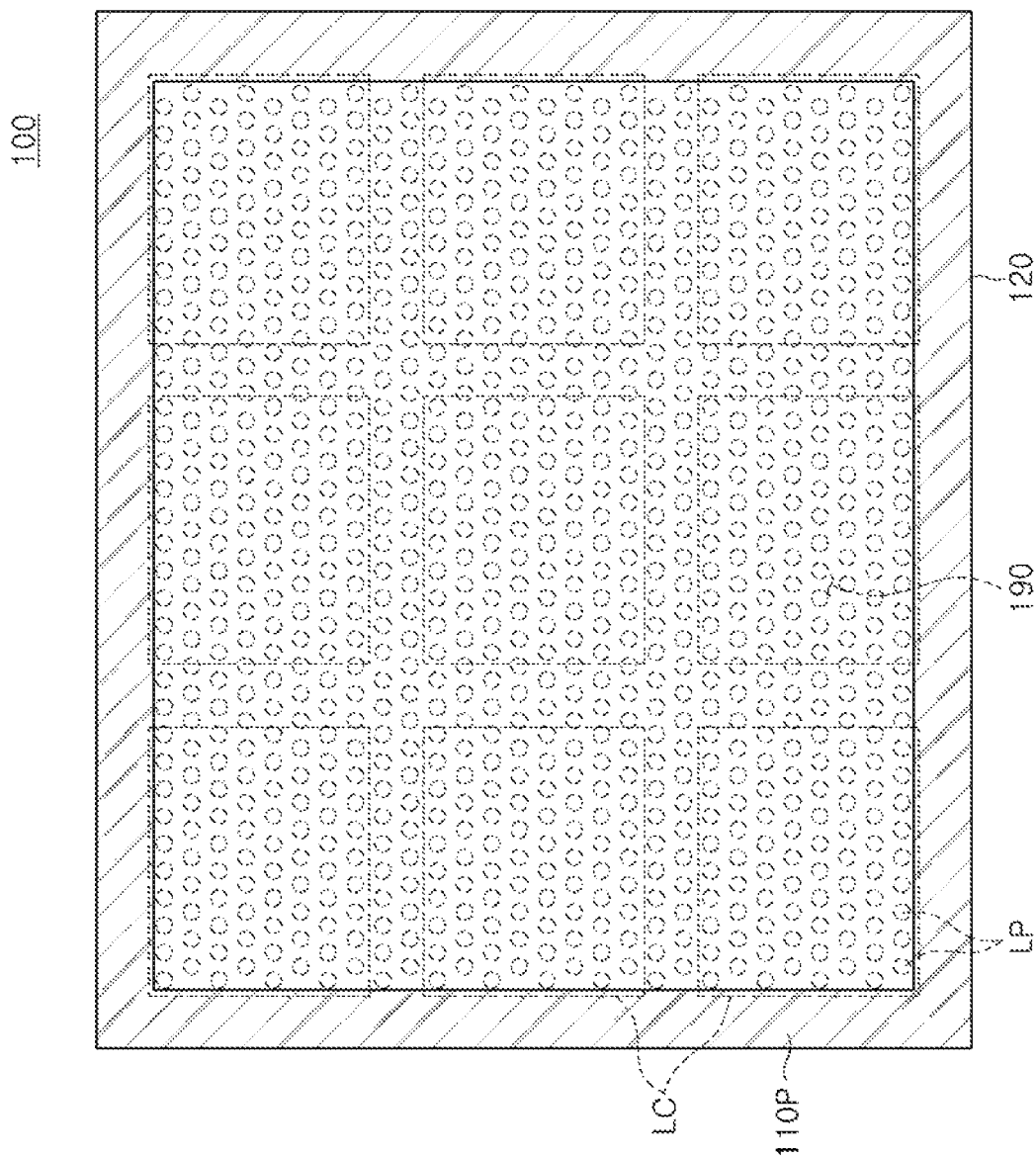
FIG. 2 is a plan view of a semiconductor light emitting device according to an embodiment.
Figure 4A:
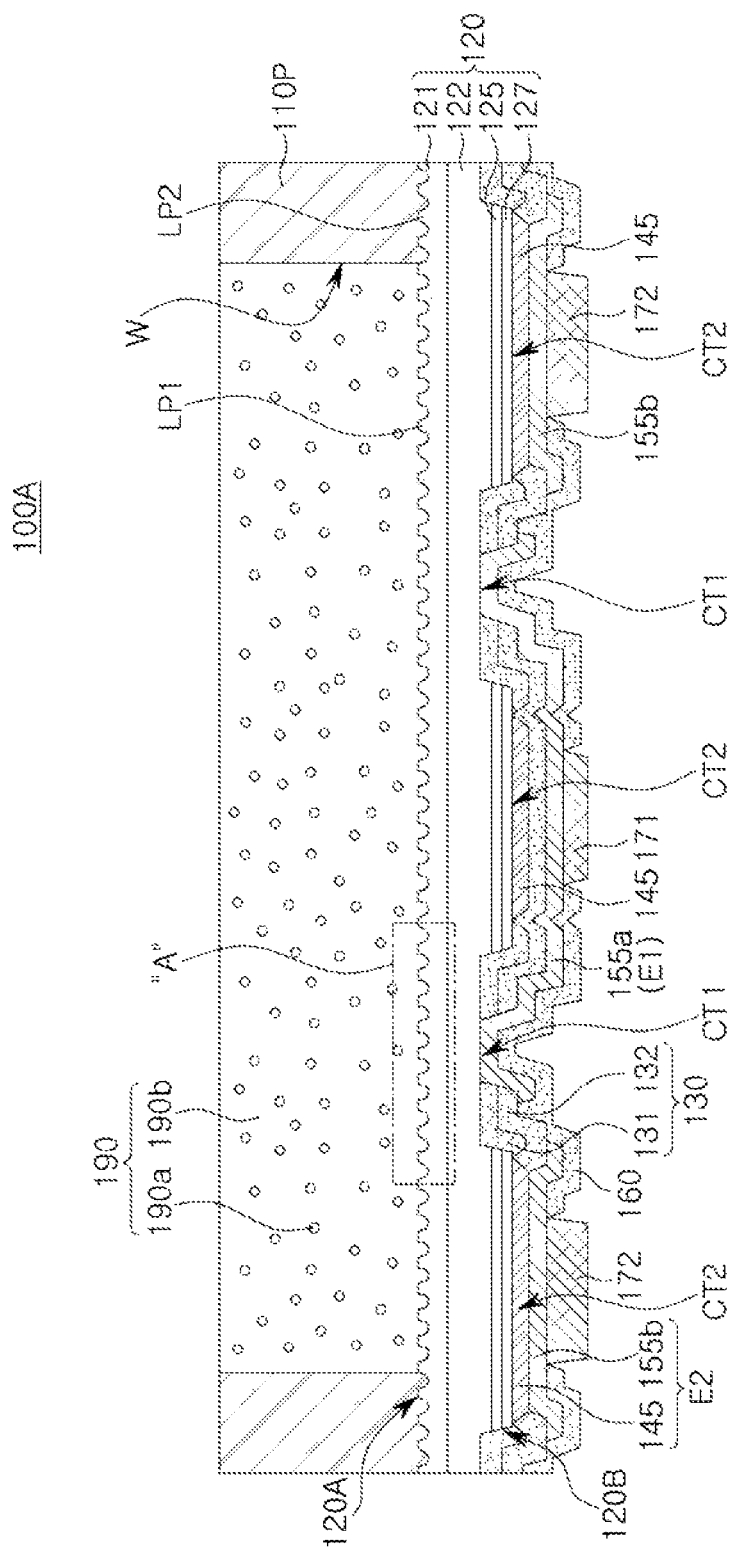
FIGS. 4A and 4B are side cross-sectional and plan views, respectively, of a semiconductor light emitting device according to an embodiment.
Figure 5:
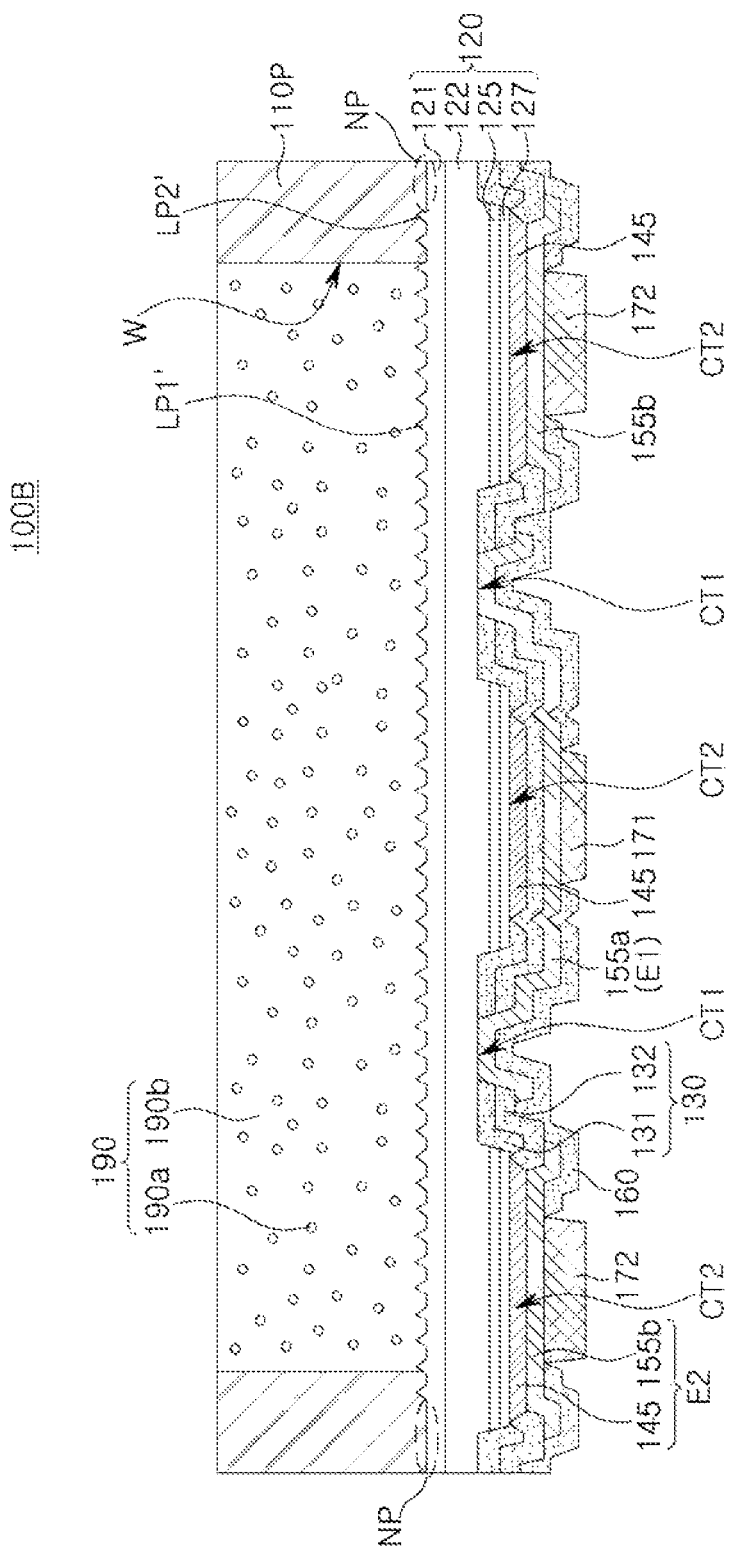
FIG. 5 is a side cross-sectional view of a semiconductor light emitting device according to an embodiment.

Referring to FIGS. 1 and 2, the plurality of patterns LP may only be formed in or on the light emitting region of the first surface 120A. In an implementation, the plurality of patterns LP may not be in or on a region of the first surface 120A contacting the partition structure 110P. The selective arrangement of the plurality of patterns LP may be obtained by limiting a patterned region of the growth substrate to a region corresponding to the light emitting region in advance. In an implementation, e.g., as illustrated in FIGS. 4A and 5, light extraction patterns may even be formed in at least a portion of regions of the first surface 120A contacting the partition structure 110P.

The wavelength converter 190 may include a wavelength converting material 190a such as a phosphor or a quantum dot, and a transparent resin 190b in which the wavelength converting material is dispersed. The wavelength converting material 190a may be configured to convert a wavelength of light generated by the active layer 125. In an implementation, the active layer 125 may be configured to emit blue light, and the wavelength converting material may include at least one of a red wavelength converting material, a yellow wavelength converting material, or a green wavelength converting material.

The first conductivity-type semiconductor layer 122 may be a nitride semiconductor layer satisfying n-type $Al_xIn_yGa_{1-x-y}N$ ($0 \leq x \leq 1$, $0 \leq y \leq 1$, $0 \leq x+y \leq 1$), and the n-type impurity may be Si. In an implementation, the first conductivity-type semiconductor layer 122 may be n-type GaN. The second conductivity-type semiconductor layer 127 may be a nitride semiconductor layer satisfying p-type $Al_xIn_yGa_{1-x-y}N$, and the p-type impurity may be Mg. In an implementation, the second conductivity-type semiconductor layer 127 may be p-type AlGaN/GaN. The active layer 125 may have a multiple quantum well (MQW) structure in which a quantum well layer and a quantum barrier layer are alternately stacked with each other. In an implementation, the active layer 125 may have a GaN/InGaN multiple quantum well (MQW) structure.

The undoped semiconductor layer 121 may have various buffer structures including a buffer layer grown directly on the growth substrate. In an implementation, the buffer layer may be $In_xAl_yGa_{1-x-y}N$ ($0 \leq x \leq 1$, $0 \leq y \leq 1$). In an implementation, the buffer layer may include a plurality of layers having different compositions, or may include layers of which composition is gradually changed. The undoped semiconductor layer 121 may include a substantial thickness of undoped GaN on the buffer layer. In an implementation, the growth substrate may be a silicon substrate, and the partition structure 110P may be a portion of the silicon substrate. In this case, a complex buffer structure having various layers may be used, and the undoped semiconductor layer 121 may be a portion of the complex buffer structure.

The first and second electrodes E1 and E2 may be connected to a region of the first conductivity-type semiconductor layer 122 and a region of the second conductivity-type semiconductor layer 127, respectively. A hole or trench passing through the second conductivity-type semiconductor layer 127 and the active layer 125 may be formed to expose a region of the first conductivity-type semiconductor layer 122. As illustrated in FIG. 2, a lattice trench may be formed in the semiconductor laminate 120 to provide a plurality of mesa structures LC.

An insulating layer 130 having openings defining first and second contact regions CT1 and CT2 for the first and second electrodes E1 and E2 may be on the second surface 120B of the semiconductor laminate 120. The first electrode E1 may include a first connection electrode 155a connected to the first contact region CT1 of the first conductivity-type semiconductor layer 122. The second electrode E2 may include an ohmic contact 145 on the second contact region CT2 of the second conductivity-type semiconductor layer 127, and a second connection electrode 155b on the ohmic contact 145.

In an implementation, the insulating layer 130 may include first and second insulating layers 131 and 132. The first insulating layer 131 may expose the first and second contact regions CT1 and CT2, and the second insulating layer 132 may expose a contact region between the connection electrode 155b and the ohmic contact 145, together with the first contact region CT1. The second insulating layer 132 may cover a region of the ohmic contact 145 located in the second contact region CT2. In an implementation, the first and second connection electrodes 155a and 155b may include a material, e.g., Ag, Ni, Al, Rh, Pd, Ir, Ru, Mg, Zn, Pt, Au, or the like, and may be employed as a single layer or as a structure of two or more layers. In an implementation, the second connection electrode 155b and the first connection electrode 155a may be formed in the same process. The first connection electrode 155a and the second connection electrode 155b may include the same material. As used herein, the term "or" is not an exclusive term, e.g., "A or B" would include A, B, or A and B.

The semiconductor light emitting device 100 may include a protective insulating layer 160 having an opening exposing some regions of the first connection electrode 155a and the second connection electrode 155b. Some regions of the first and second connection electrodes 155a and 155b may be regions for forming first and second electrode pads 171 and 172 thereon. The first and second electrode pads 171 and 172 may be in or on exposed regions of the first and second connection electrodes. In an implementation, the first connection electrode 155a may extend onto a region of the second insulating layer 132 on a mesa region of the semiconductor laminate 120, and at least a portion of the second electrode pad 172 may overlap the extended region.

At least one of the first and second insulating layers 131 and 132 or the protective insulating layer 160 may include, e.g., $SiO_2$, $Si_3N_4$, $HfO_2$, $SiON$, $TiO_2$, $Ta_2O_3$, or $SnO_2$. In an implementation, at least one of the first and second insulating layers 131 and 132 or the protective insulating layer 160 may be a reflective insulating layer. In an implementation, the reflective insulating layer may have a distributed Bragg reflector (DBR) structure in which dielectric layers having different refractive indices are alternately stacked. In an implementation, the reflective metal layer may be on at least one of the first and second insulating layers 131 and 132 or the protective insulating layer 160 (see FIGS. 13A to 13C).

In an implementation, the semiconductor laminate 120 may include a plurality of LED cells separated in a stacking direction, and at least one of the first or second electrode E1 or E2 may have a plurality of independent electrode structures, corresponding to each of the cells, to selectively drive the plurality of LED cells (see FIGS. 13A to 13D).

Patterns that may be employed in this embodiment may be changed in various forms. In the previous embodiment, the plurality of patterns LP are illustrated as being arranged only in or on the light emitting region of the first surface 120A, but may also be in at least a portion of the first surface 120A, among regions contacting the partition structure 110P. In an implementation, a plurality of patterns may be changed into various shapes. These various examples will be described with reference to FIGS. 4A and 4B, and FIG. 5.

Figure 4B:
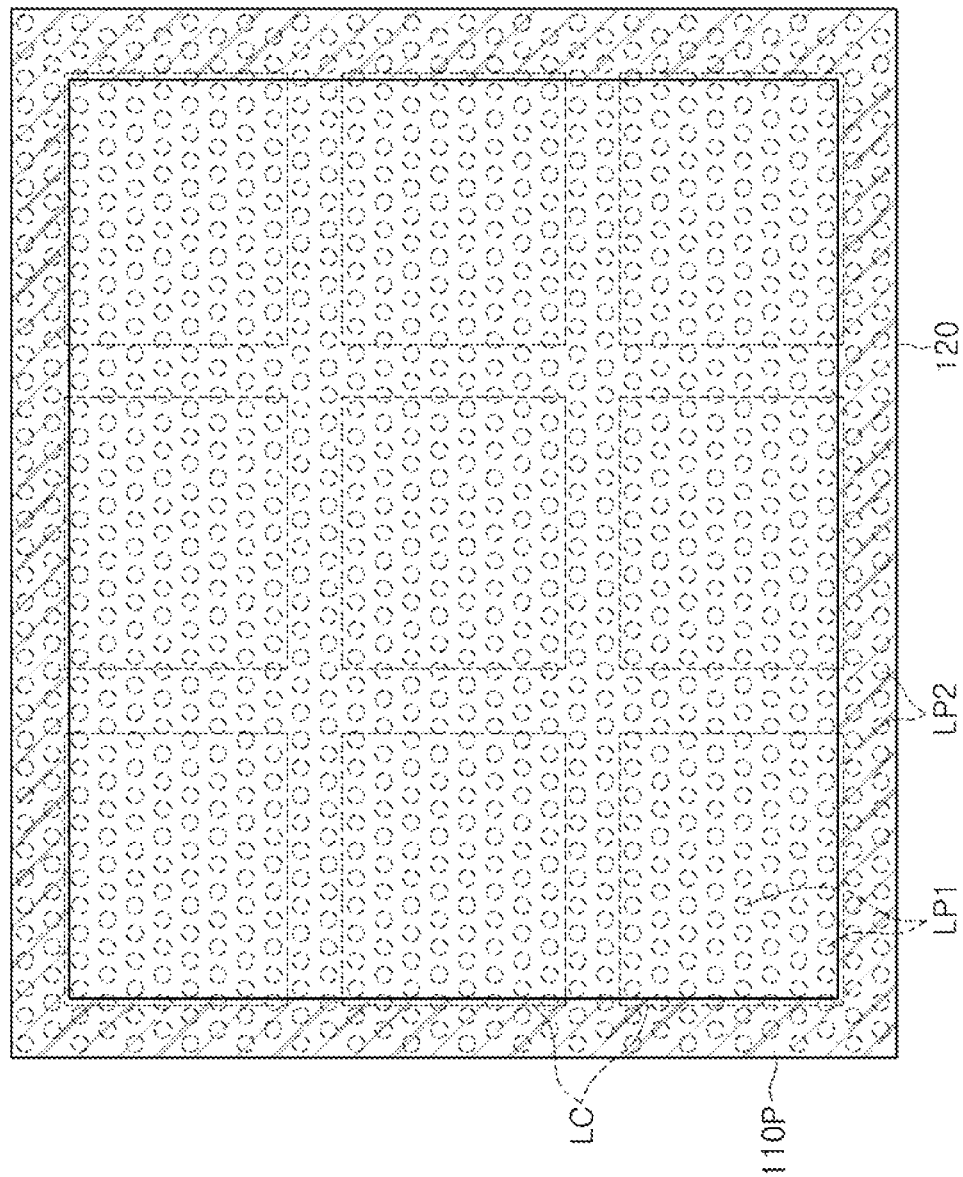

FIGS. 4A and 4B are side cross-sectional and plan views, respectively, illustrating a semiconductor light emitting device according to an embodiment.

Referring to FIGS. 4A and 4B, a semiconductor light emitting device 100A according to this embodiment may be similar to the semiconductor light emitting device 100 illustrated in FIGS. 1 to 3B, except that a plurality of patterns LP2 may also be in or on a region contacting a partition structure 110P on a first surface 120A of a semiconductor laminate 120. In addition, elements of this embodiment can be understood with reference to the description of the same elements as or similar elements to those of the semiconductor light emitting device 100 described in FIGS. 1 to 3B, unless otherwise specified.

The semiconductor light emitting device 100A according to this embodiment may include a plurality of patterns LP1 and LP2 entirely arranged on the first surface 120A of the semiconductor laminate 120 (e.g., completely covering the first surface 120A). The plurality of patterns may include a plurality of first and second patterns LP1 and LP2 according to a formation region thereof. Similarly to the previous embodiment, the plurality of first patterns LP1 may correspond to a light emitting region of the first surface 120A of the semiconductor laminate 120. In an implementation, the plurality of first patterns LP1 may be arranged in or on a region corresponding to a window W of the partition structure 110P. The plurality of second patterns LP2 may be arranged in or on a region on the first surface 120A contacting (e.g., underlying) the partition structure 110P. The plurality of first patterns LP1 may have substantially the same shape, and may be arranged at a regular interval. The plurality of second patterns LP2 may have substantially the same shape as the shape of the plurality of first patterns LP1, and may be arranged at the same interval as the interval between the plurality of first patterns LP1. In an implementation, the plurality of first and second patterns LP1 and LP2 may be obtained from a growth substrate having a textured growth surface obtained by a single texturing process (e.g., a dry etching process using a photoresist pattern), and the plurality of second patterns LP2 may be arranged to have the same regularity as the plurality of first patterns LP1.

FIG. 5 is a side cross-sectional view of a semiconductor light emitting device according to an embodiment.

Referring to FIG. 5, a semiconductor light emitting device 100B according to this embodiment is similar to the semiconductor light emitting device 100 illustrated in FIGS. 1 to 3B, except that a plurality of second patterns LP2' may be formed in a region contacting a partition structure 110P on a first surface 120A, and a plurality of first and second patterns LP1' and LP2' may have different shapes. In addition, elements of this embodiment can be understood with reference to the description of the same elements as or similar elements to those of the semiconductor light emitting device 100 described in FIGS. 1 to 3B, unless otherwise specified.

Similar to the embodiment illustrated in FIG. 4A, a semiconductor laminate 120 may include a plurality of first patterns LP1' arranged in or on a light emitting region of the first surface 120A, and a plurality of second patterns LP2' arranged in or on a region contacting the partition structure 110P on the first surface 120A. The plurality of first patterns LP1 and the plurality of second patterns LP2' may have the same regularity.

In an implementation, the plurality of first and second patterns LP1' and LP2' may have a convex structure having a triangular cross-section. The plurality of second patterns LP2' may be in a portion of the region contacting the partition structure 110P, e.g., a portion adjacent to the light emitting region.

FIGS. 6A to 6F and FIGS. 7A to 7D are cross-sectional views of stages in a method of manufacturing a semiconductor light emitting device according to an embodiment. The processes illustrated in FIGS. 6A to 6F are a process of forming a semiconductor laminate and an electrode structure, A process of forming the partition structure is illustrated in FIGS. 7A to 7D.

Figure 6A:
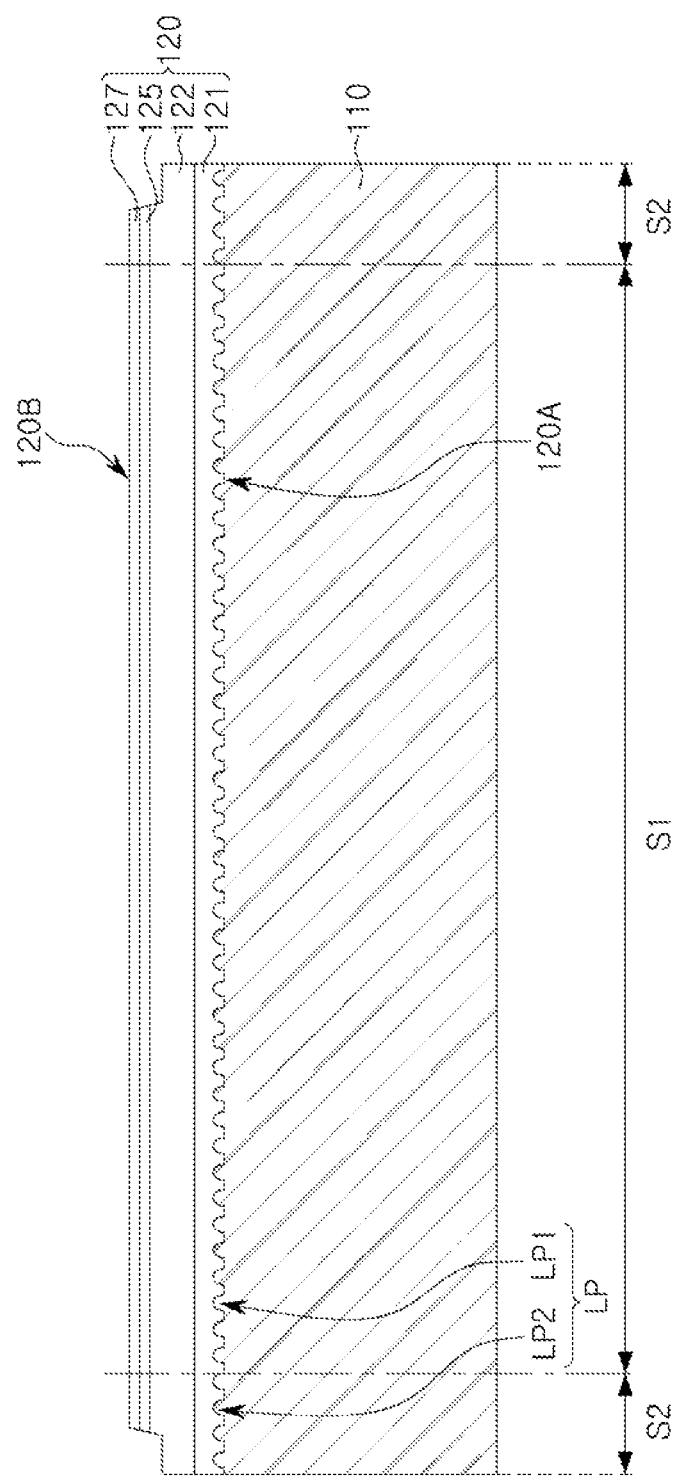
FIGS. 6A to 6F are cross-sectional views of stages in a method of manufacturing a semiconductor light emitting device according to an embodiment.

Referring to FIG. 6A, a semiconductor laminate 120 may be formed on a growth substrate 110 having a transfer pattern SP. The semiconductor laminate 120 may include an undoped semiconductor layer 121 having a buffer layer, a first conductivity-type semiconductor layer 122, an active layer 125, and a second conductivity-type semiconductor layer 127.

The transfer pattern SP may have a non-planar structure. In an implementation, the non-planar structure may be a convex structure or a concave structure. In an implementation, the transfer pattern SP of the growth substrate 110 may have a hemispherical convex structure. The transfer pattern SP of the growth substrate 110 may be formed using a texture process using a photoresist and dry etching for patterning. Unlike a wet etching process, this patterning process may form a uniform pattern over an entire region of the growth substrate, and may be repeatedly performed as a process with excellent reproducibility.

The semiconductor laminate 120 may be grown by a process such as MOCVD, MBE, or HVPE. The semiconductor laminate 120 may be grown on a growth surface of the growth substrate 110 on which the transfer pattern SP has been formed, and a plurality of patterns LP may be transferred to a first surface 120A of the semiconductor laminate 120, e.g., a surface of the undoped semiconductor layer 121 contacting the growth substrate 110. As described above, the semiconductor laminate 120 including the undoped semiconductor layer 121 may include a nitride semiconductor satisfying $In_xAl_yGa_{1-x-y}N$ ($0 \le x \le 1$, $0 \le y \le 1$). As illustrated in FIG. 6A, a first region S1 defined as a light emitting region by a window W of a partition structure (110P in FIG. 1) may be in the growth substrate 110 (e.g., a wafer), and a second region S2 in which a partition structure (110P in FIG. 1) is to be disposed may be present. The plurality of patterns LP may include a plurality of first patterns LP1 in or on the first region S1, and a plurality of second patterns LP2 in or on the second region S2, in a final structure.

Figure 6B:
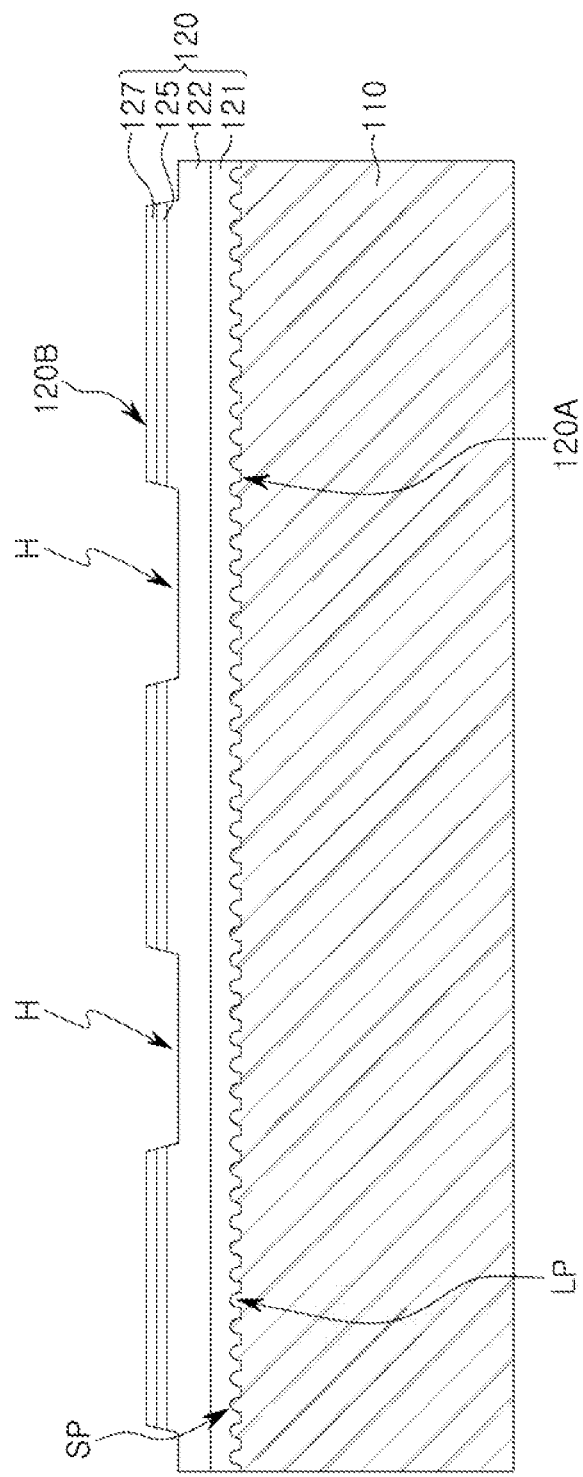

Next, referring to FIG. 6B, a trench H exposing a portion of the first conductivity-type semiconductor layer 122 may be formed in the semiconductor laminate 120.

This process may be performed by an etching process of removing a portion of the second conductivity-type semiconductor layer 127 and a portion of the active layer 125. A portion of the first conductivity-type semiconductor layer 122 exposed by the trench H may be a portion for a first electrode. In an implementation, a plurality of LED cells may be configured by forming the trench H to a depth up to the growth substrate 110 to separate the semiconductor laminate 120 in the stacking direction.

Next, a series of processes of forming first and second electrodes E1 and E2 respectively connected to one region of the first conductivity-type semiconductor layer 122 and one region of the second conductivity-type semiconductor layer 127 may be performed. This electrode formation process may be performed by the processes of FIGS. 6C to 6F.

Figure 6C:
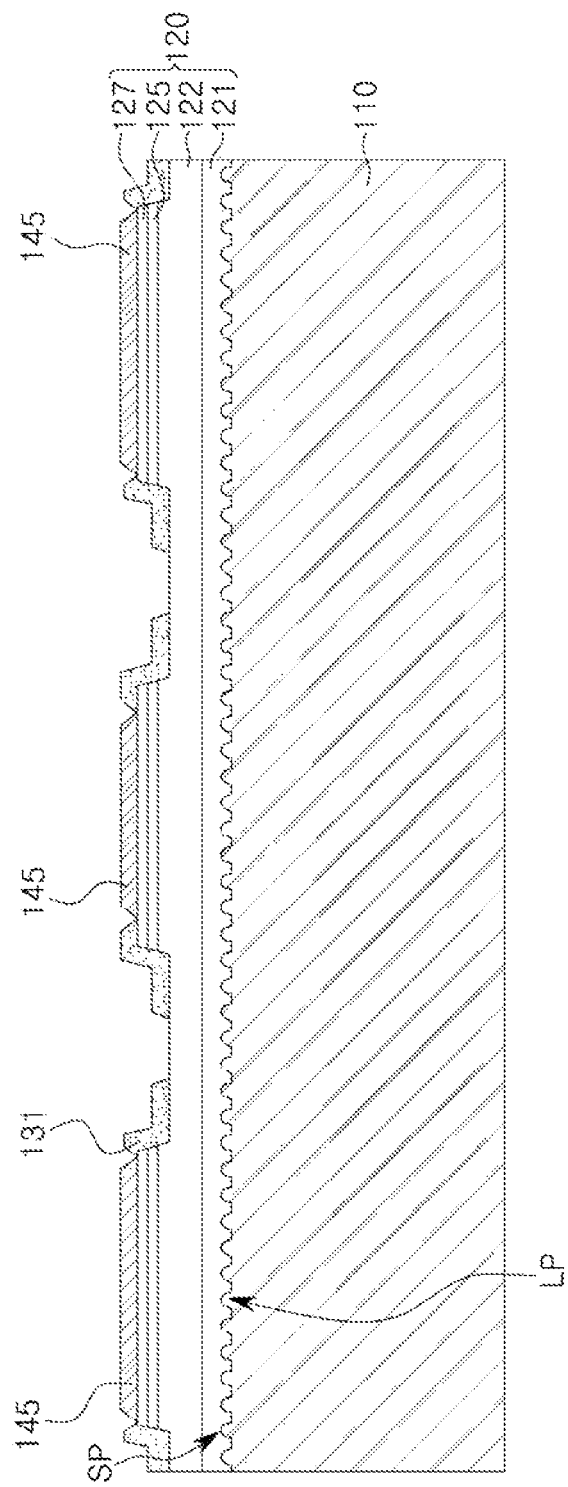

First, referring to FIG. 6C, an ohmic contact 145 may be formed on an upper surface of the second conductivity-type semiconductor layer 127.

In this process, after forming a first insulating layer 131 entirely on an upper surface of the semiconductor laminate 120, a region in which the ohmic contact 145 is formed may be exposed using a mask, and the ohmic contact 145 may be deposited in the exposed region. In an implementation, the first insulating layer 131 may include $SiO_2$, $Si_3N_4$, $HfO_2$, $SiON$, $TiO_2$, $Ta_2O_3$, or $SnO_2$. As described above, the first insulating layer 131 may be a DBR multilayer layer in which dielectric layers having different refractive indices are alternately stacked. The ohmic contact 145 may include a highly reflective ohmic contact material having a high reflectivity while forming an ohmic contact with the second conductivity-type semiconductor layer 127. In an implementation, the ohmic contact 145 may include Ag or Ag/Ni. A barrier layer may be additionally formed on the ohmic contact 145. In an implementation, the barrier layer may be Ti or Ni/Ti.

Figure 6D:
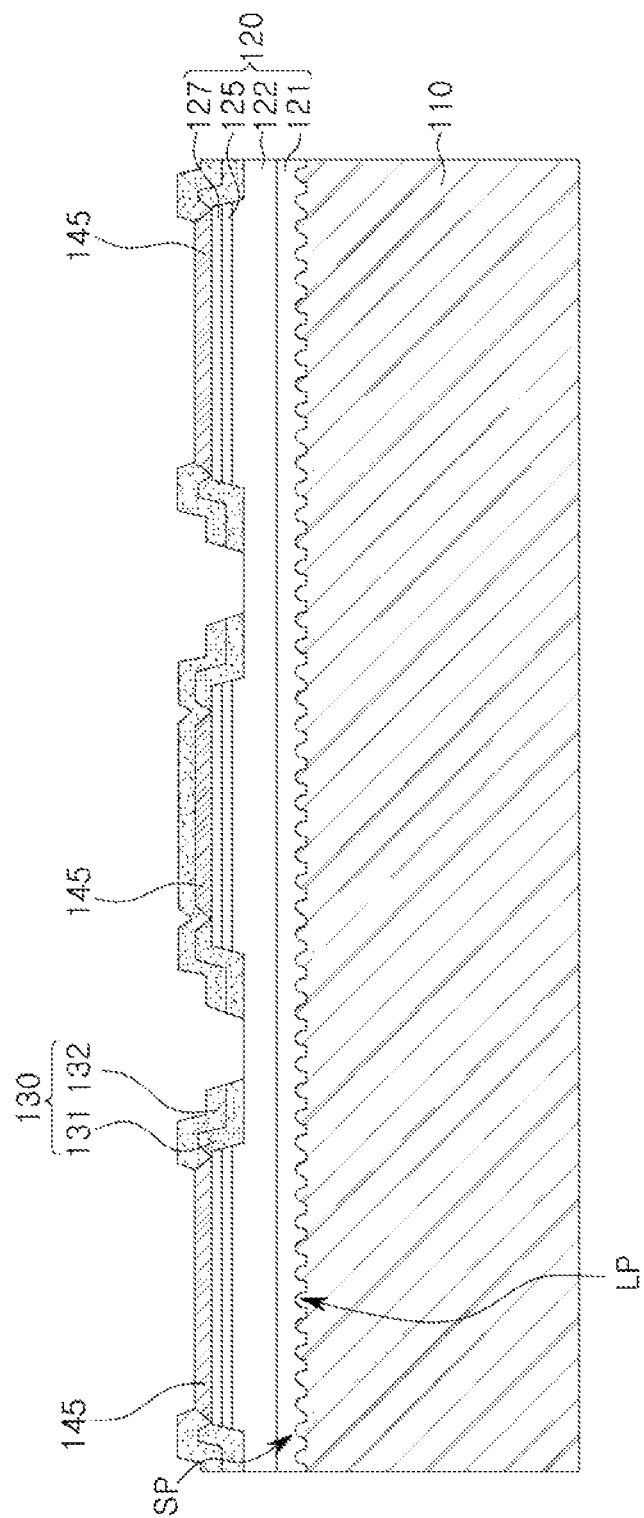

Next, referring to FIG. 6D, a second insulating layer 132 having first and second openings may be formed on the second surface 120B of the semiconductor laminate 120.

The first and second openings may be formed to expose a portion of the first conductivity-type semiconductor layer 122 and a portion of the ohmic contact 145, respectively. In this opening formation, after forming an insulating material layer on the second surface 120B of the semiconductor laminate 120, the second insulating layer 132 may be formed using a mask for forming the first and second openings. The first and second openings may define contact regions for first and second electrodes (CT1 and CT2 in FIG. 1). The second insulating layer 132 may be formed to cover the ohmic contact 145 located on a portion of a mesa region. The second insulating layer 132 can be understood as an insulating layer 130 having a single passivation structure with the first insulating layer 131. In an implementation, the second insulating layer 132 may be the same material as the first insulating layer 131.

Figure 6E:
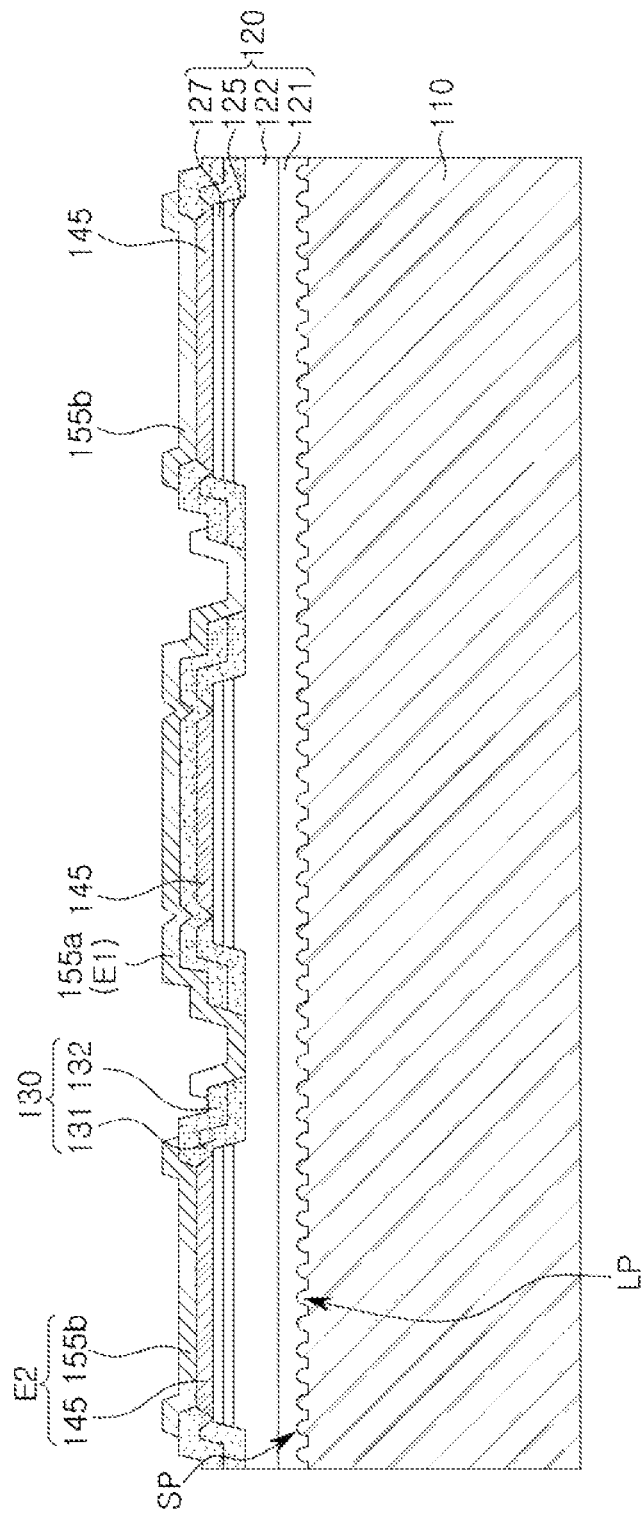

Next, referring to FIG. 6E, first and second connection electrodes 155a and 155b connected to the exposed portions of or in the first and second openings, respectively, may be formed.

The first connection electrode 155a may be a first electrode E1, and the second connection electrode 155b may be a second electrode E2, together with the ohmic contact 145. In an implementation, a conductive material layer may be formed on the insulating layer 130 to be connected to the contact regions of the first and second openings. The conductive material layer may be separated to be divided into first and second connection electrodes 155a and 155b, respectively, connected to contact regions of the first and second openings. In an implementation, the first and second connection electrodes 155a and 155b may include a material such as Ag, Ni, Al, Rh, Pd, Ir, Ru, Mg, Zn, Pt, Au, or the like, and may be employed as a single layer or as a structure of two or more layers. In the mesa region covered with the ohmic contact 145 by the second insulating layer 132, a portion of the first electrode E1 (e.g., the first connection electrode 155a) may extend to an upper surface of the insulating layer 130, and may have a portion overlapping the second electrode E2 with the second insulating layer 132 interposed therebetween.

Figure 6F:
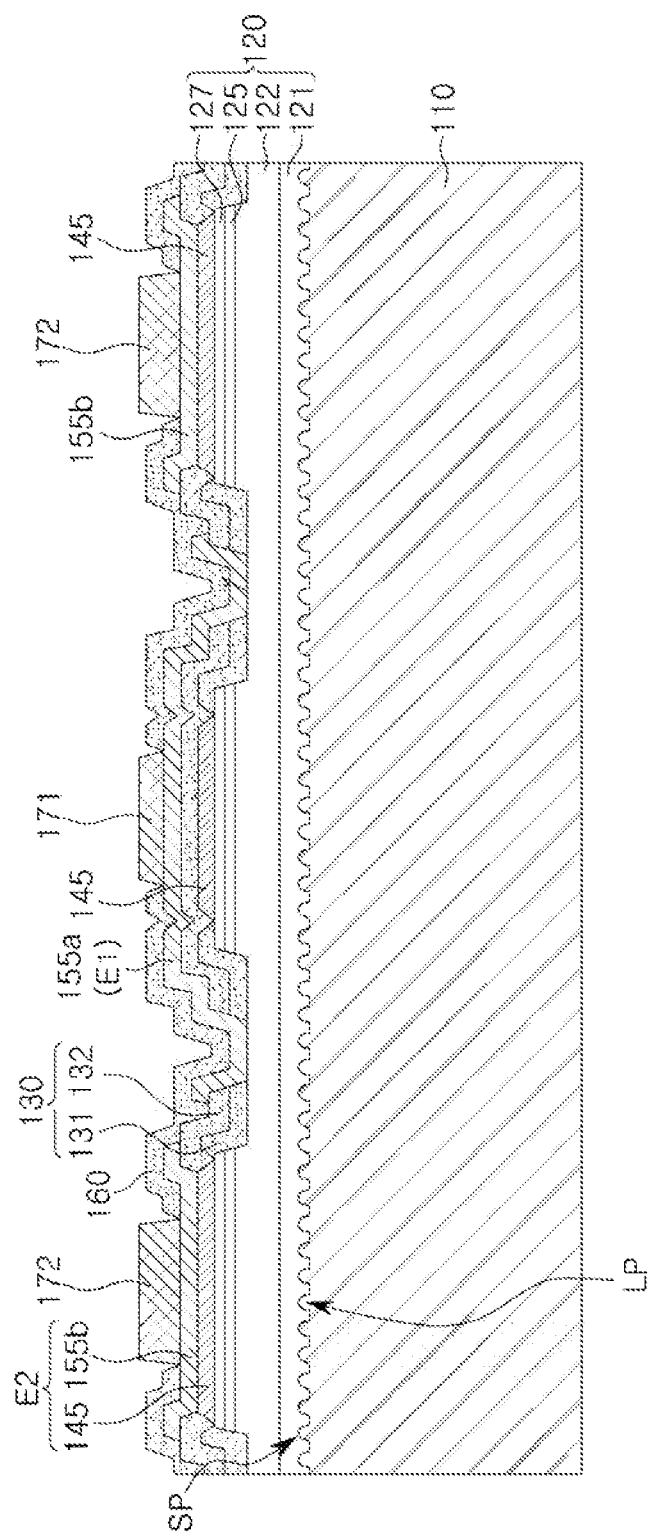

Next, referring to FIG. 6F, first and second electrode pads 171 and 172 may be formed on a portion of the first electrode E1 and a portion of the second electrode E2, respectively.

After a protective insulating layer 160 is formed in the entire region of the semiconductor laminate, a region of pad formation may be exposed, and the first and second electrode pads 171 and 172 may be formed in the exposed region. Each of the first and second electrode pads 171 and 172 may be formed on the mesa region. The first electrode pad 171 may be on a portion of the first connection electrode 155a extending over the mesa region. The second electrode pad 172 may be on the second connection electrode 155b. At least one of the first or second electrode pad 171 or 172 may include a plurality of pads.

FIGS. 7A to 7D are cross-sectional views of stages in a method of manufacturing a semiconductor light emitting device according to an embodiment. In these processes, a process of forming a partition structure and a wavelength converter may be performed using the semiconductor light emitting device obtained previously.

Referring to FIG. 7A, a temporary support 181 may be provided on a second surface of a semiconductor laminate 120, e.g., a surface on which first and second electrodes E1 and E2 are formed.

The temporary support 181 may be bonded on the second surface of the semiconductor laminate 120 using a bonding layer 185. In an implementation, the bonding layer 185 may include bonding materials such as various energy curable resins such as ultraviolet curable resins. In an implementation, the bonding layer 185 may use a material that may be easily removed and cleaned in a subsequent process.

Figure 7B:
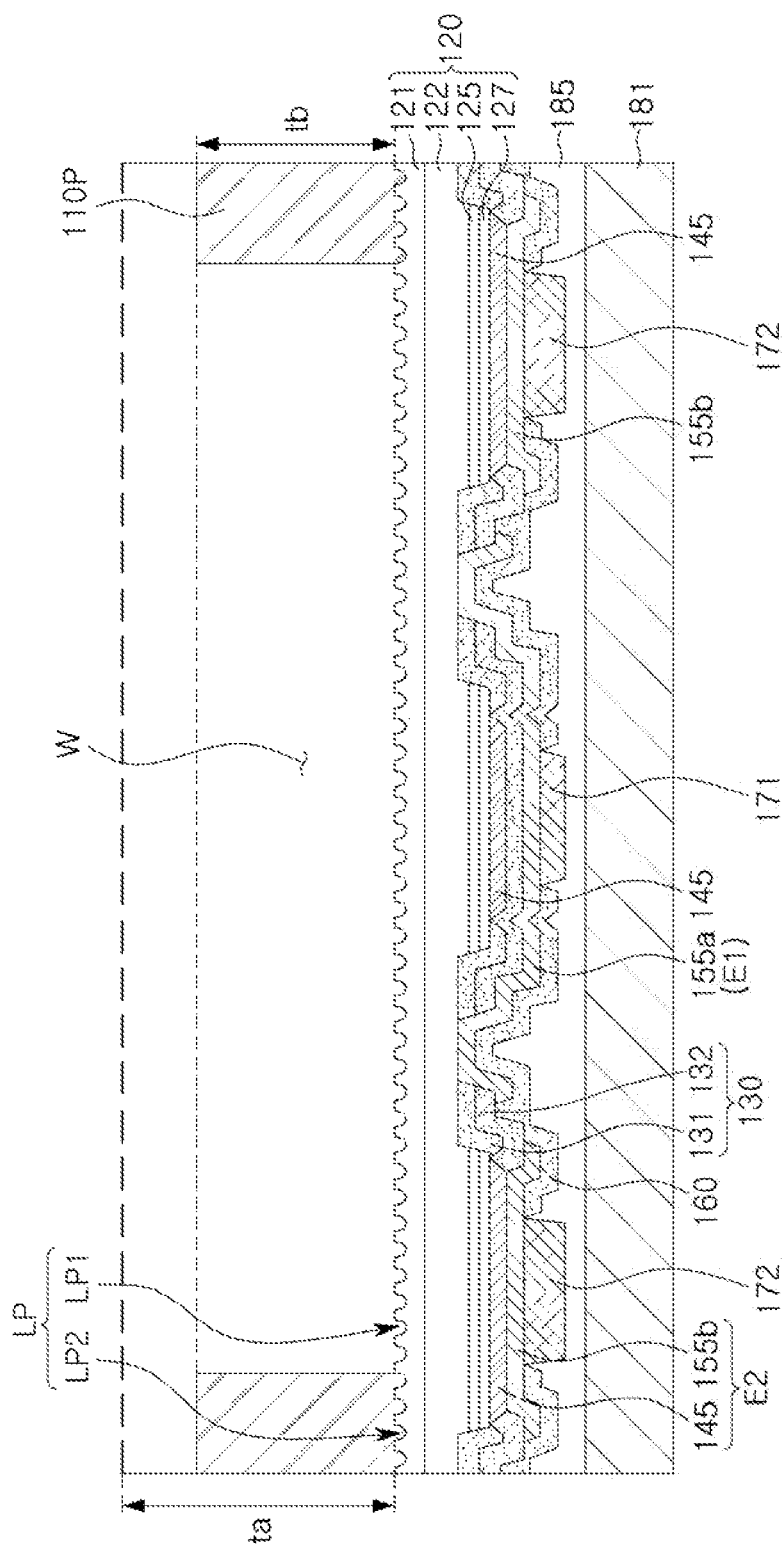

Next, referring to FIG. 7B, a growth substrate 110 may be processed to form a partition structure 110P having a window W.

Removal of the growth substrate 110 may be performed by various processes such as laser lift-off, mechanical polishing or mechanical chemical polishing, or chemical etching. When a silicon substrate is used, mechanical strength may be relatively low. Therefore, the growth substrate may be removed using a mechanical or mechanical chemical polishing process.

In an implementation, the buffer layer may remain. In an implementation, at least a portion of the buffer layer may be removed together, as needed.

Next, referring to FIG. 7B, the growth substrate 110 may be processed from or on the semiconductor laminate 120 to form a partition structure 110P having a window W.

In an implementation, the partition structure 110P may have a shape obtained by processing the growth substrate 110. A polishing process may be performed such that a first thickness to of the growth substrate 110 is reduced to a second thickness tb to correspond to a height of the desired partition structure 110P. Subsequently, the growth substrate 110 may be partially removed to form the window W, to expose a region of the first surface 120A of the semiconductor laminate 120 corresponding to the light emitting region. A plurality of first patterns LP1 may be arranged in a region of the first surface 120A of the semiconductor laminate 120 exposed by the window W. The plurality of first patterns LP1 may be patterns obtained from the transfer pattern SP described above, and may have regularity corresponding (e.g., complementary) to the transfer pattern SP. In an implementation, a plurality of second patterns LP2 may be in a region on (e.g., underlying) the partition structure 110P on the first surface 120A, and the plurality of second patterns LP2 may have the same regularity as the plurality of first patterns LP1.

Figure 7C:
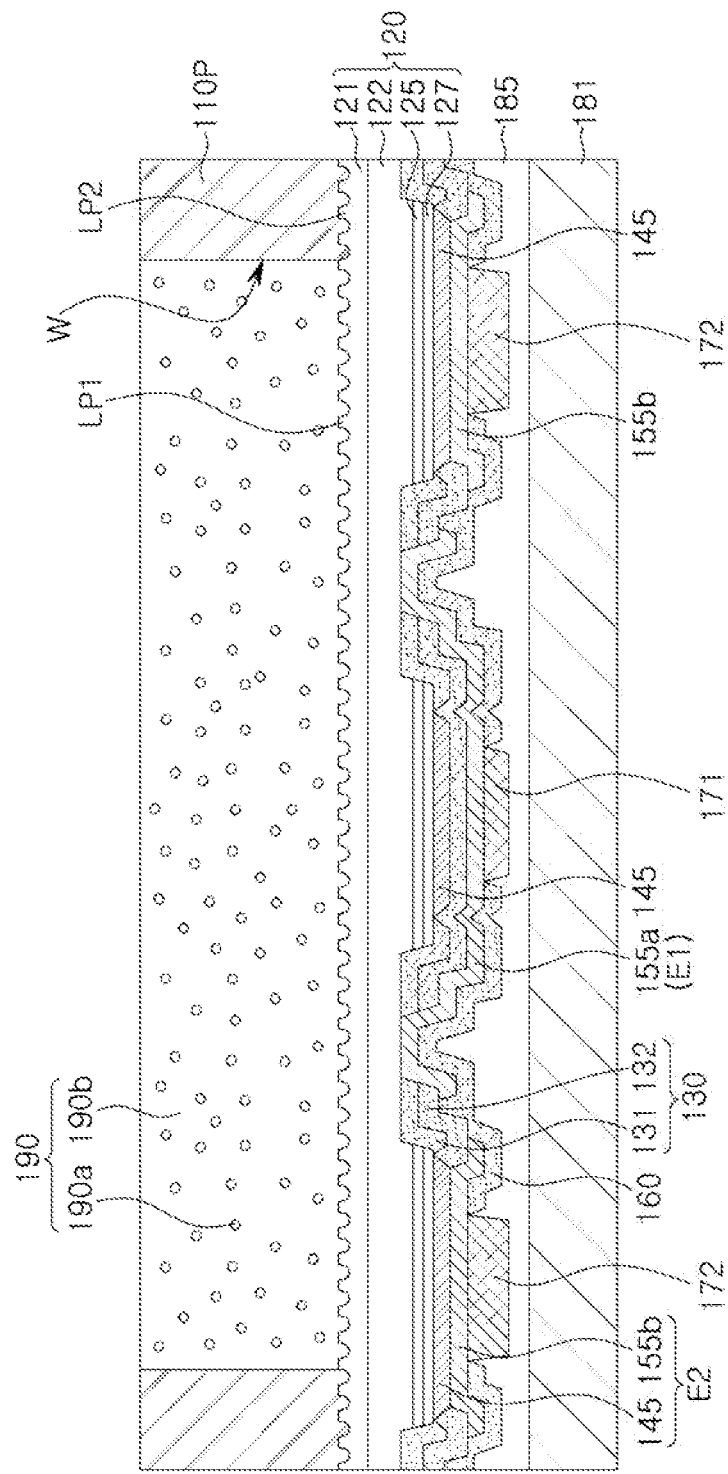

Subsequently, referring to FIG. 7C, a wavelength converter 190 may be formed in the window W of the partition structure 110P.

The wavelength converter 190 may be configured to convert light generated from the active layers 125 into light having a different wavelength. In an implementation, the wavelength converter 190 may be configured to convert light into red light, green light, or yellow light. The wavelength converter 190 may be formed by dispensing the transparent resin 190b in which a wavelength converting material 190a is mixed. In an implementation, a color filter layer, a transparent resin layer for planarization, or the like may be additionally provided in the window W (see FIGS. 13A to 13C).

Figure 7D:
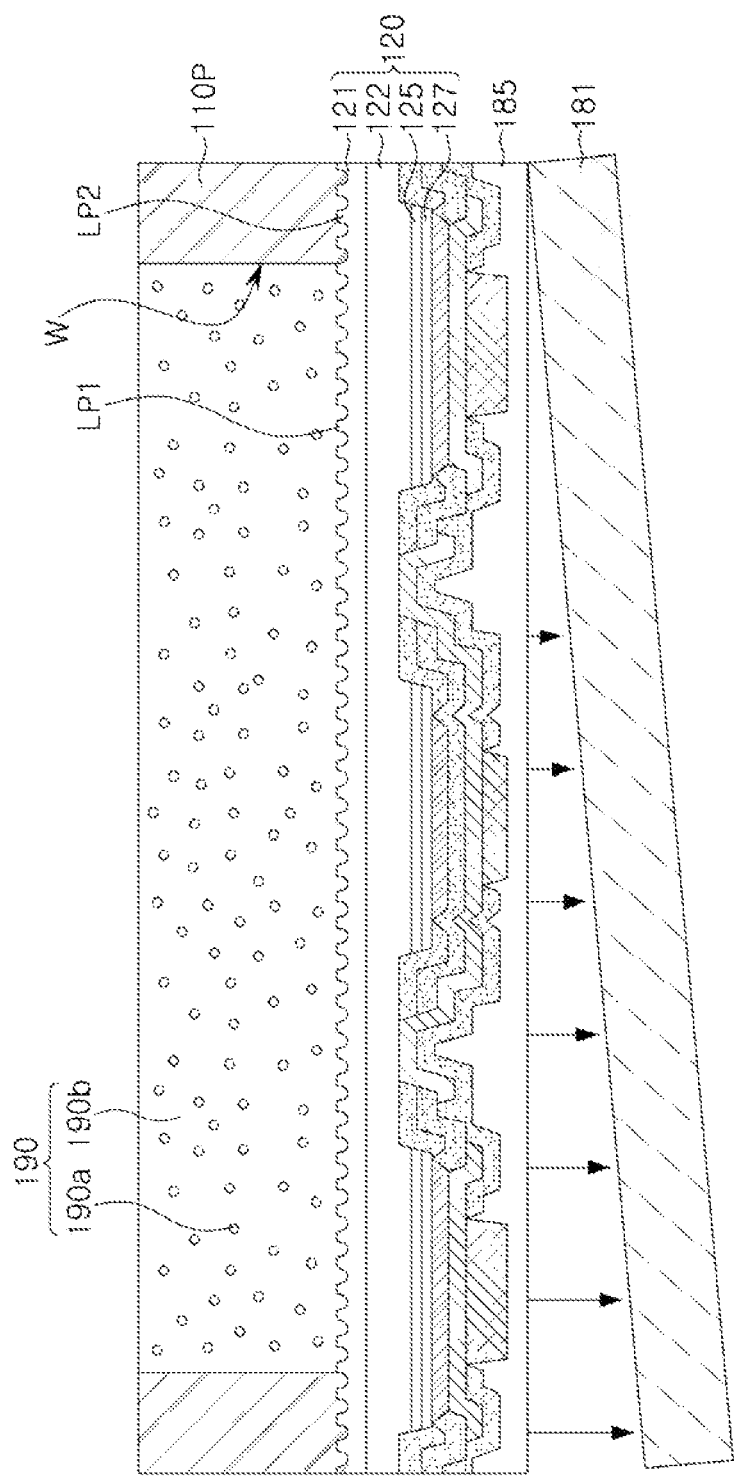

Next, referring to FIG. 7D, the temporary support 181 may be removed from the semiconductor laminate 120. After removing the temporary support 181, the bonding layer 185 may be removed using a cleaning process.

A transfer pattern of the growth substrate may be transferred as a light extraction pattern corresponding to the surface of the semiconductor laminate contacting the growth substrate, during the growth process of the semiconductor laminate. In an implementation, when the transfer pattern has a convex structure or a concave structure, the light extraction pattern of the semiconductor laminate may have a concave structure or a convex structure corresponding or complementary thereto. In this manner, the light extraction pattern of the semiconductor laminate may be variously changed, depending on a pattern formed on the growth substrate.

Figure 8A:
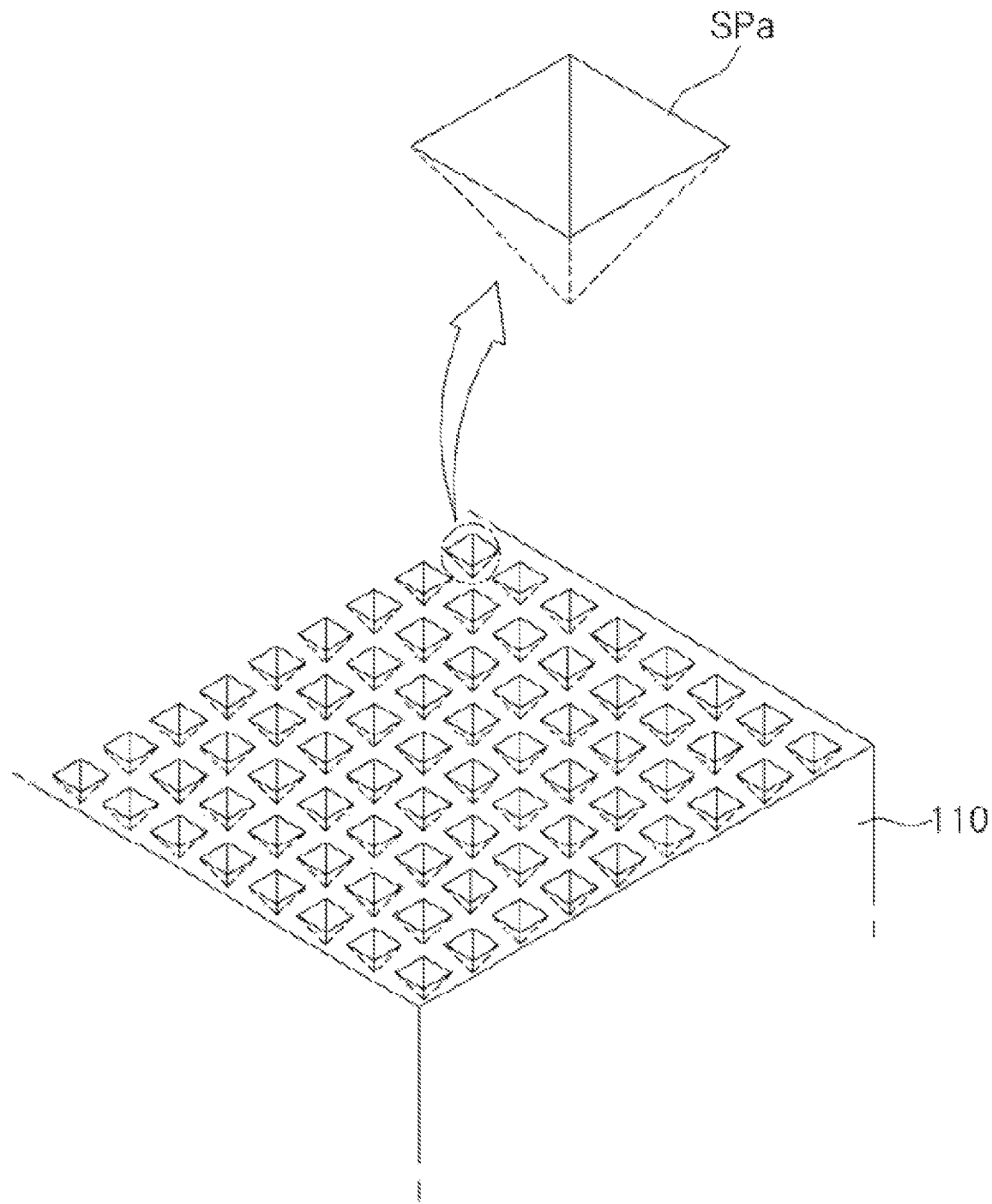
FIGS. 8A and 8B are perspective views of examples of a pattern of a growth substrate and a pattern transferred to a semiconductor laminate, which may be employed in an embodiment.
Figure 8B:
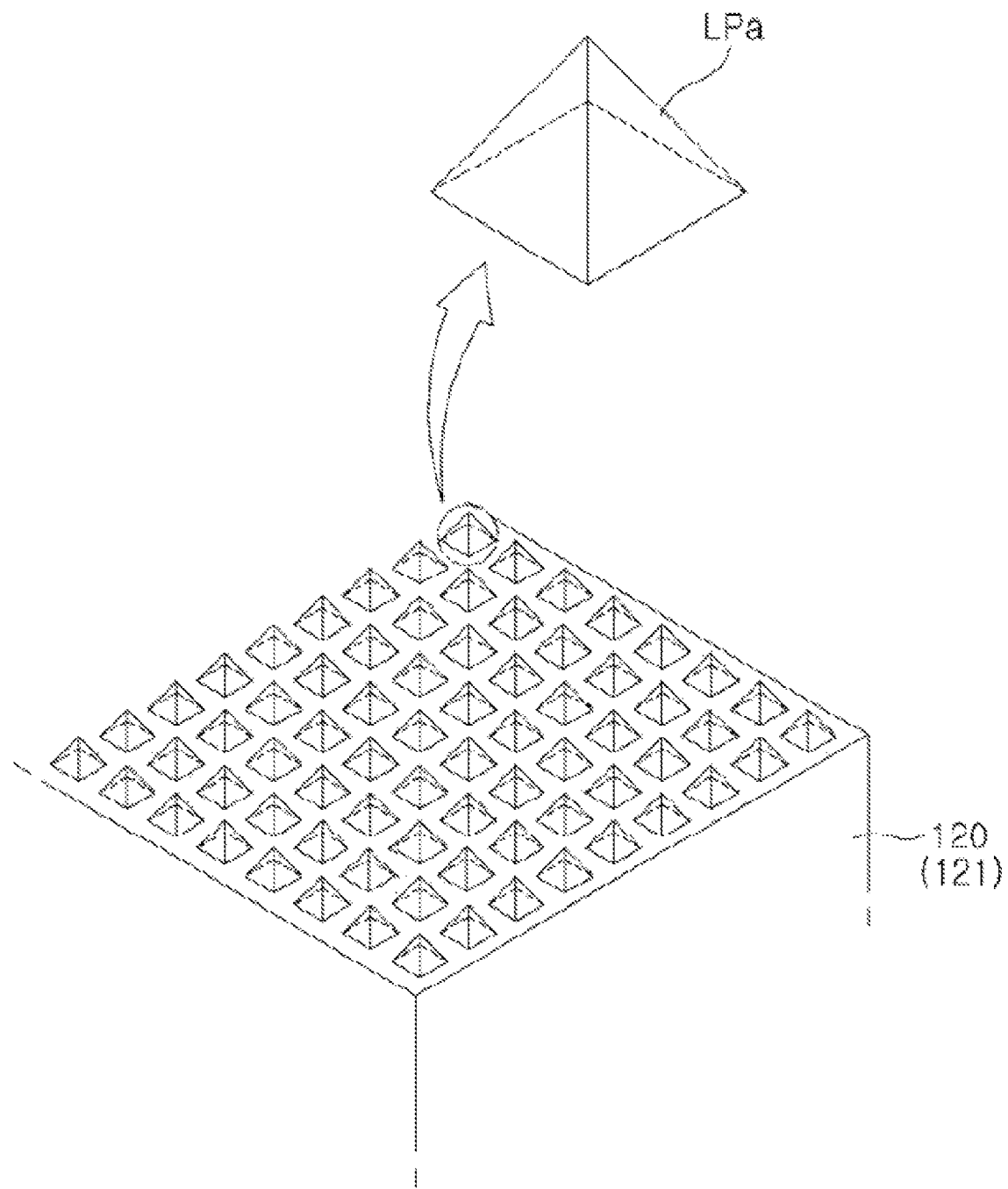

Referring to FIG. 8A, a transfer pattern SPa of a growth substrate 110 may have a plurality of concave structures, and each of the plurality of concave structures may be a tetrahedral structure having a triangular cross-section. A light extraction pattern LPa of a semiconductor laminate 120, formed on the growth substrate 110, may have a plurality of convex structures, as illustrated in FIG. 8B, and may have a tetrahedral structure corresponding to a shape of the transfer pattern SPa.

Figure 9A:
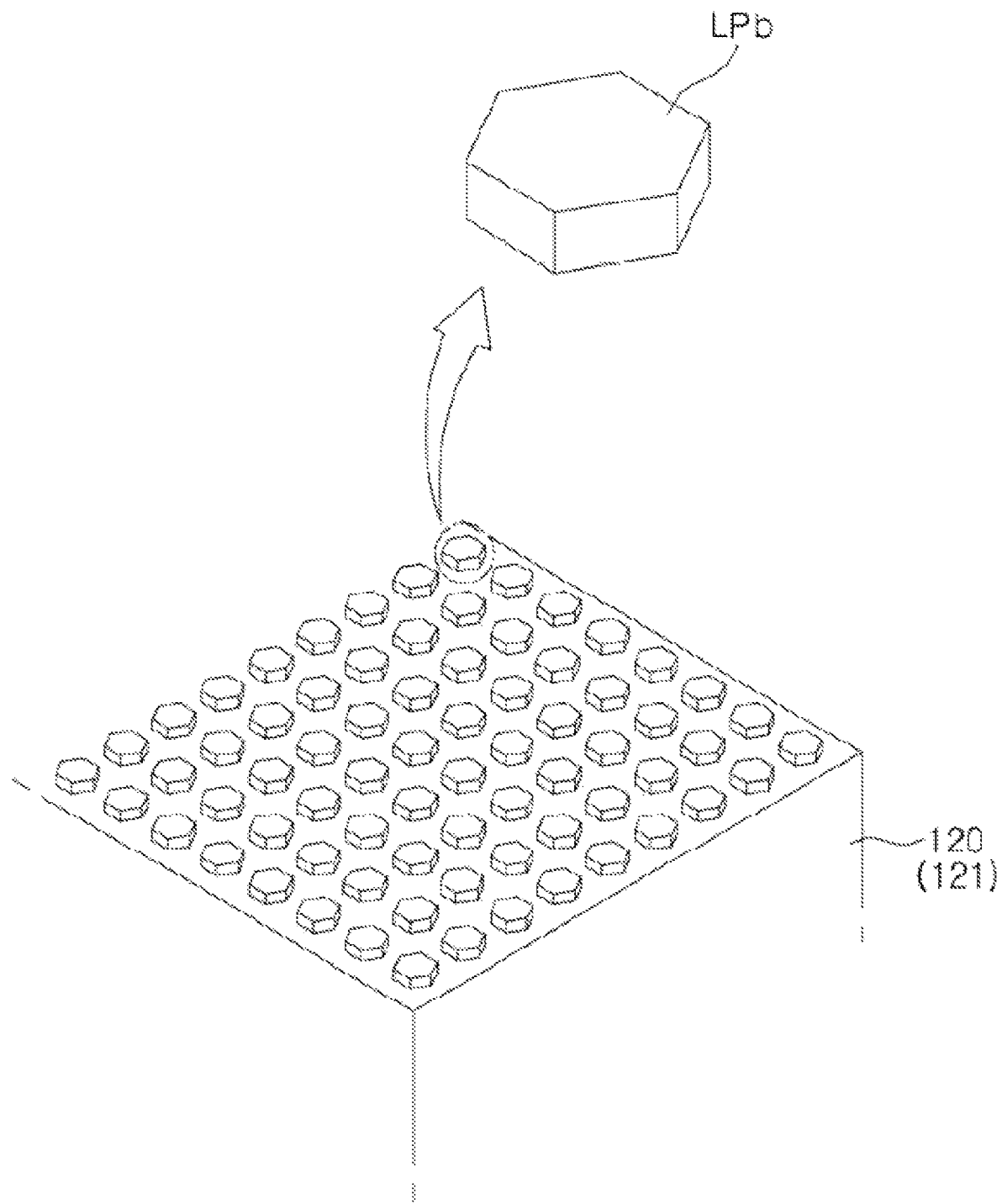
FIGS. 9A and 9B are perspective views of examples of a pattern of a growth substrate and a pattern transferred to a semiconductor laminate, which may be employed in an embodiment.
Figure 9B:
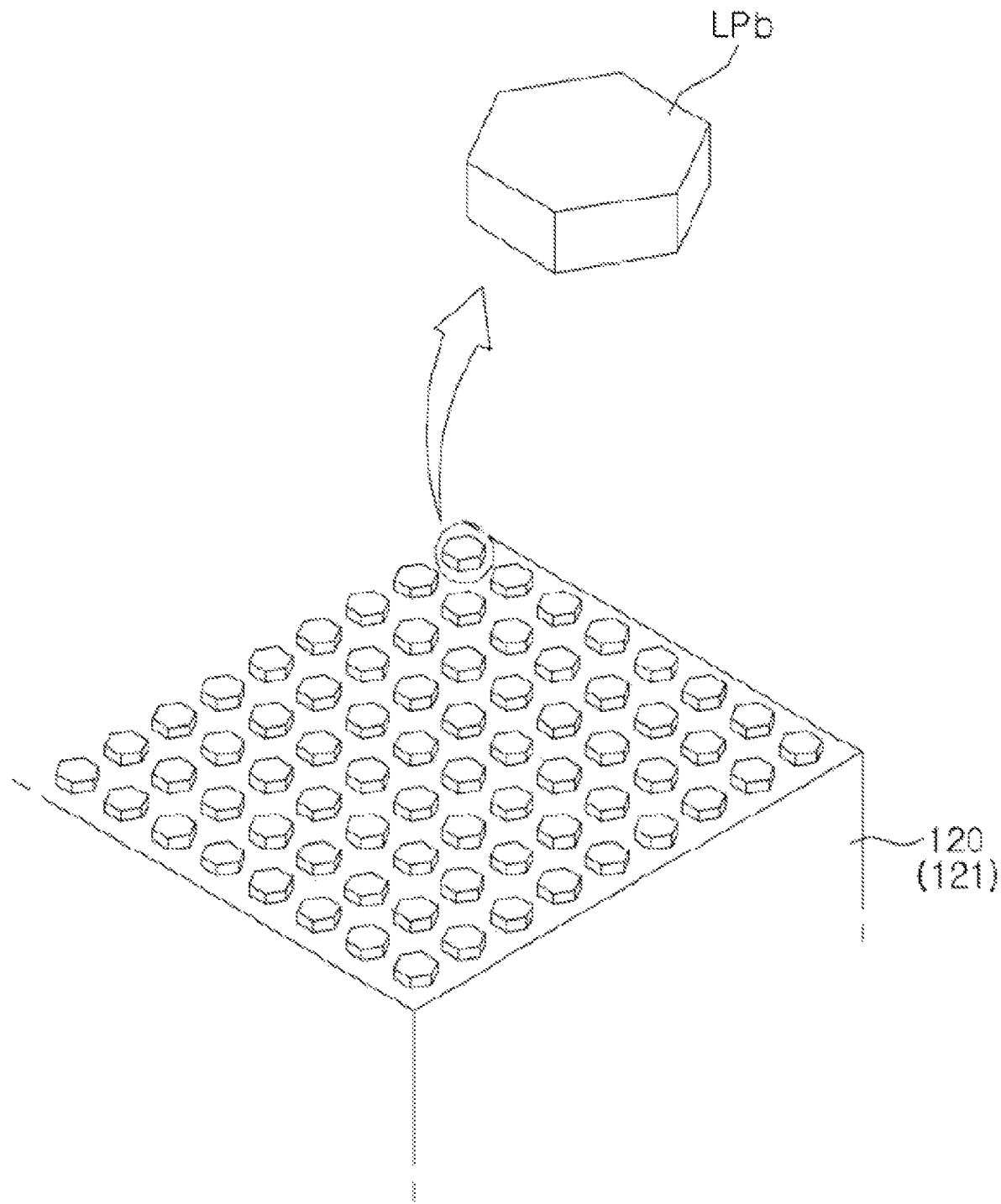

Referring to FIG. 9A, a transfer pattern SPb of a growth substrate 110 may have a plurality of concave structures, and each of the plurality of concave structures may be a hexagonal column structure. A light extraction pattern LPb of a semiconductor laminate 120, formed on the growth substrate 110, may have a plurality of convex structures, as illustrated in FIG. 9B, and may have a hexagonal column structure corresponding or complementary to a shape of the transfer pattern SPb.

In this manner, a light extraction pattern of a semiconductor laminate may have a shape and arrangement corresponding or complementary to a transfer pattern of a growth substrate. In an implementation, a structure of a pattern may be changed by applying an additional treatment to a light extraction pattern exposed by a window before forming a wavelength converter. In an implementation, additional wet etching may be applied to change a light extraction pattern.

Figure 10:
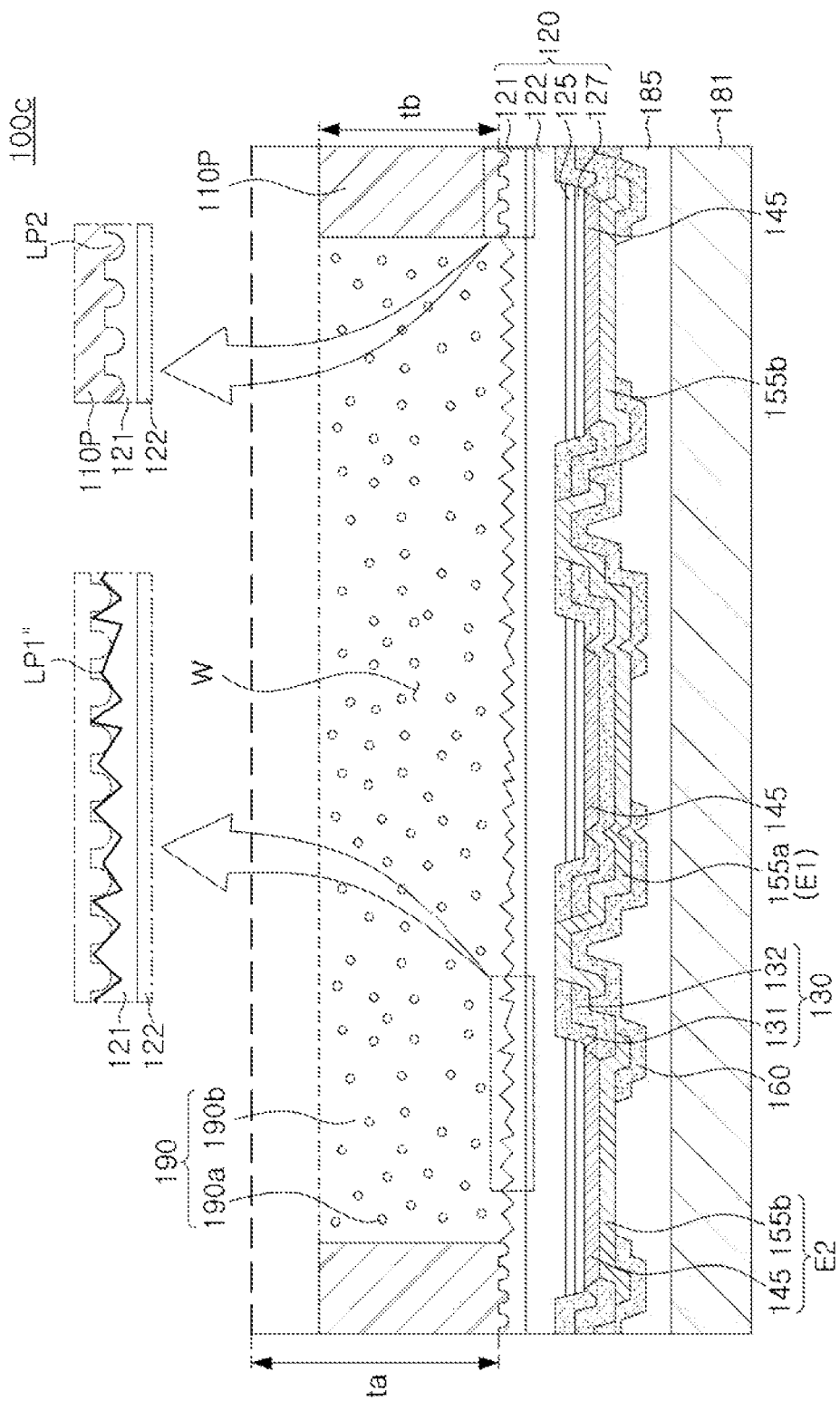
FIG. 10 is a side cross-sectional view of a semiconductor light emitting device according to an embodiment.

A semiconductor light emitting device according to an embodiment is illustrated in FIG. 10.

Referring to FIG. 10, a semiconductor light emitting device 100C according to this embodiment is similar to the semiconductor light emitting device 100A illustrated in FIGS. 4A and 4B, except that shapes and arrangement of a plurality of first patterns LP1" are different from a plurality of second patterns LP2. In addition, elements of this embodiment can be understood with reference to the description of the same elements as or similar elements to those of the semiconductor light emitting devices 100 and 100A, described in FIGS. 1 to 4A and 4B, unless otherwise specified.

The semiconductor light emitting device 100C according to this embodiment may include a plurality of first patterns LP1" arranged in a light emitting region on a first surface 120A of a semiconductor laminate 120, and a plurality of second patterns LP1 and LP2 arranged in a region contacting (e.g., underlying) a partition structure 110P on the first surface 210A. The plurality of second patterns LP2 may have substantially the same shape as or a shape similar to the embodiment illustrated in FIG. 4A, and may be arranged at a regular interval. The plurality of first patterns LP1" may have a somewhat random structure even while maintaining a comparatively uniform arrangement. After forming the plurality of first patterns LP1" to have a regularity similar to that of the second patterns LP2, as indicated by a dotted line in the enlarged view, wet etching may be additionally applied to change the pattern to a relatively random pattern, after exposing the light emitting region by the window W (FIG. 7C) and before forming the wavelength converter 190 (see FIG. 7C). In this manner, the plurality of first patterns may be irregularly arranged, and the plurality of second patterns may have substantially the same or uniform shape, and may be arranged at a regular or uniform interval. In an implementation, even when additional wet etching is applied, a light extraction pattern uniformly patterned in advance may be used, Therefore, reproducibility of the light extraction pattern may be maintained at a certain level.

Figure 11:
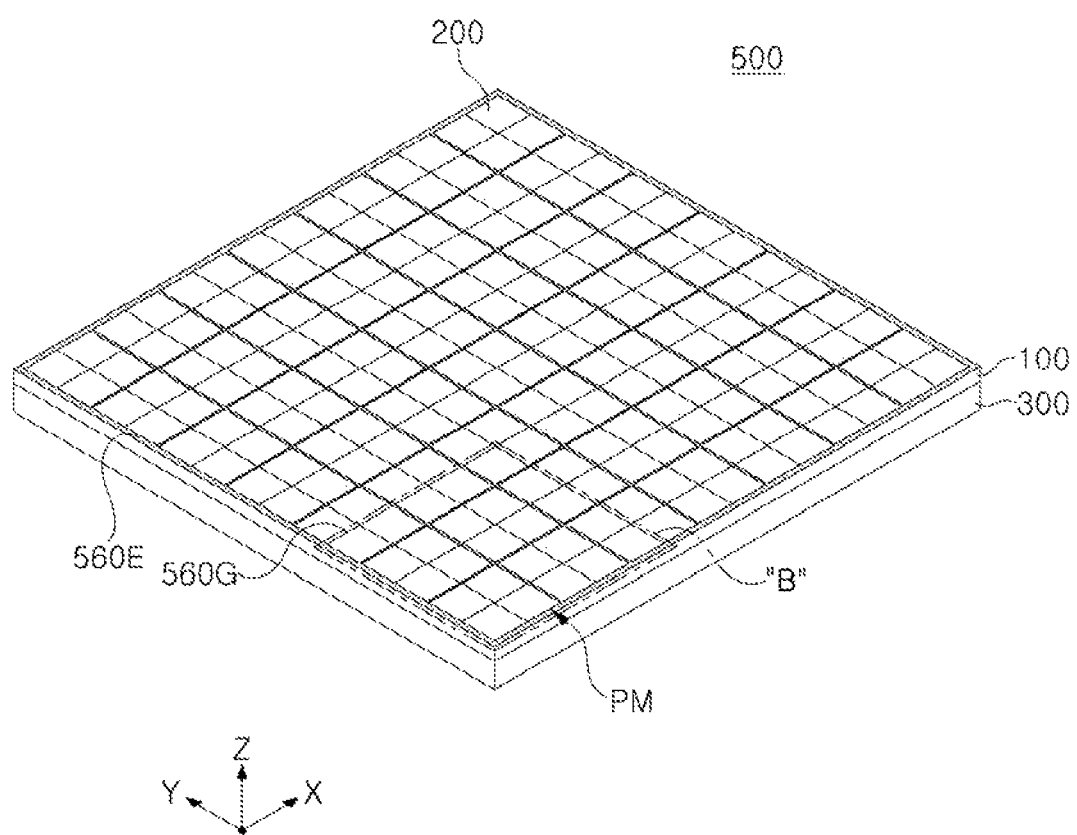
FIG. 11 is a schematic perspective view of a display device.
Figure 12A:
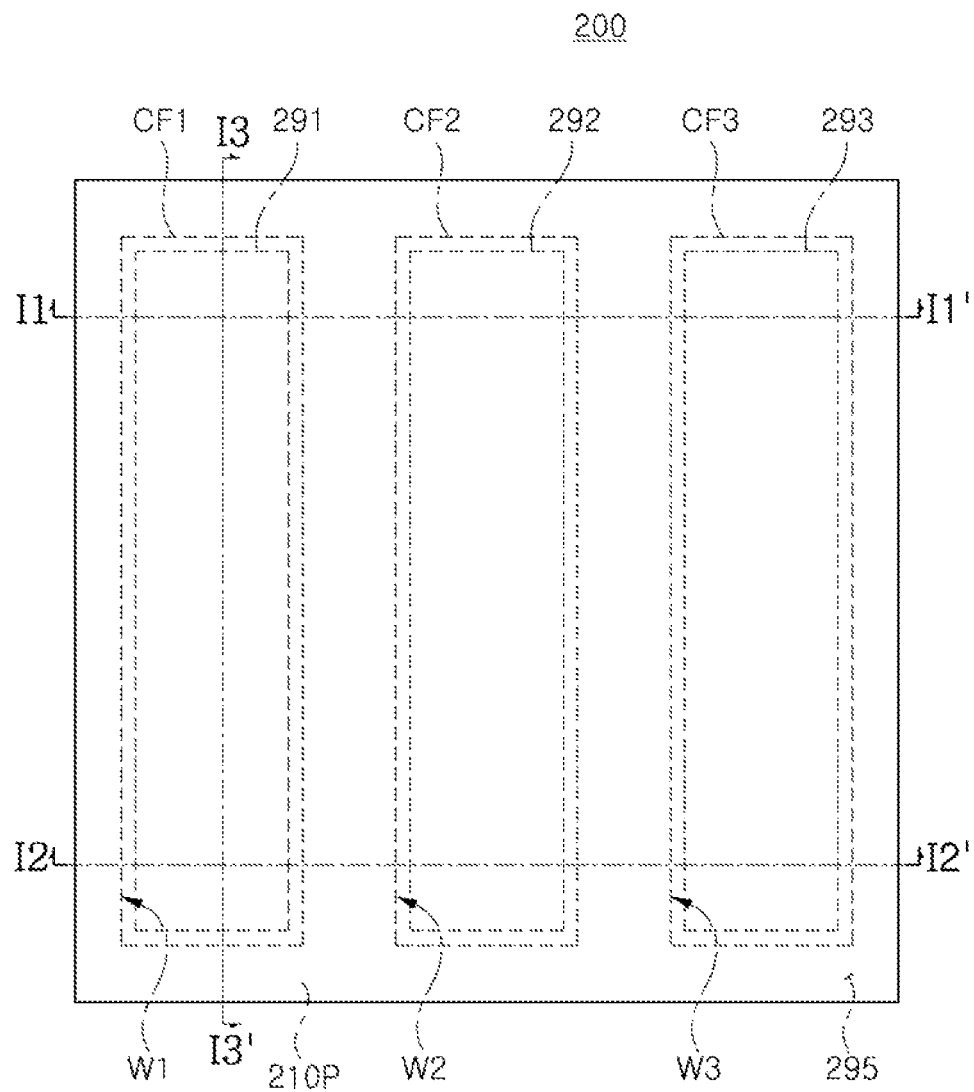
FIGS. 12A and 12B are plan and bottom views, respectively, of a semiconductor light emitting device (or an LED module) provided as a pixel of the display device illustrated in FIG. 11.
Figure 12B:
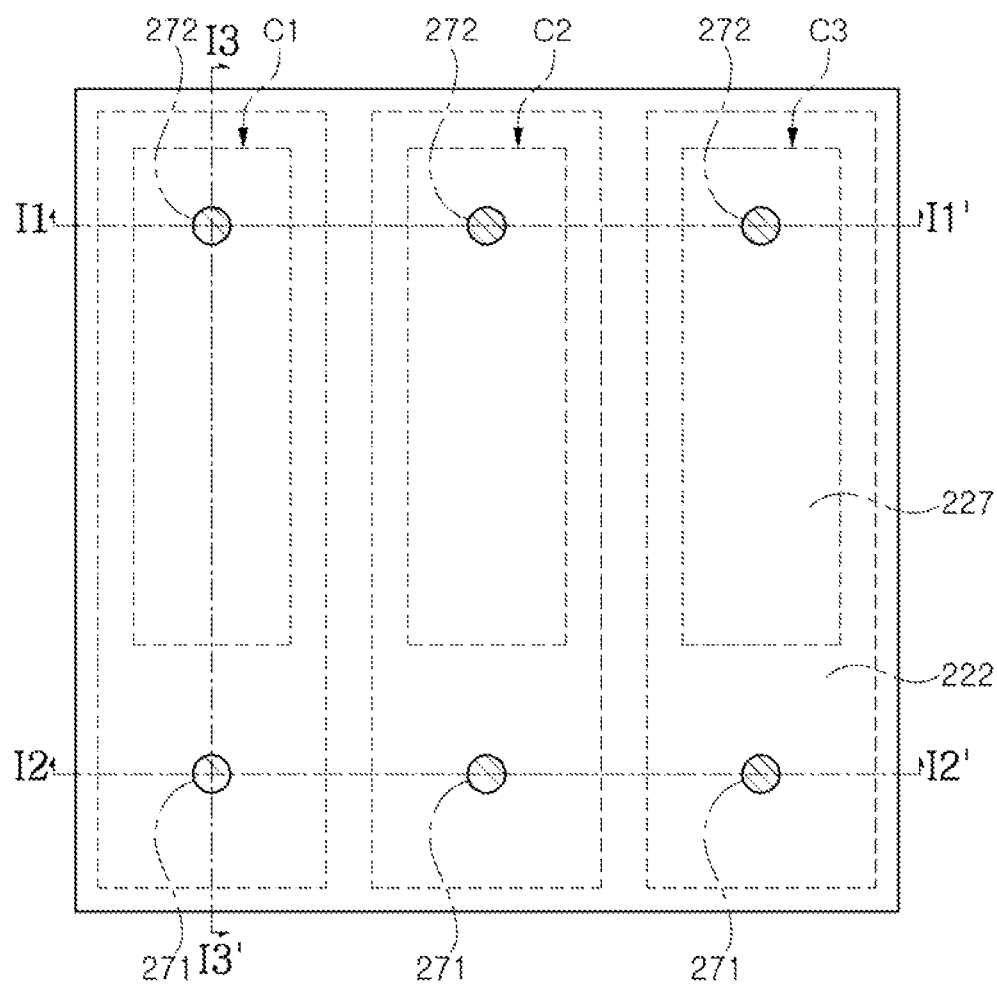

FIG. 11 is a schematic perspective view of a display device, and FIGS. 12A and 12B are plan and bottom views, respectively, of a semiconductor light emitting device provided as a pixel of the display device illustrated in FIG. 11.

Referring to FIG. 11, a display device 500 according to this embodiment may include a circuit board 300 having a driving circuit, and an LED array PM on the circuit board 300. The driving circuit may include a transistor such as a thin film transistor (TFT).

In an implementation, the circuit board 300 may have a rectangular planar structure, or may have a structure of another shape. In an implementation, the circuit board 300 may have a planar structure having a constant curvature, or may include a flexible substrate.

The LED array PM may include a plurality of LED modules 200 on the circuit board 300. The plurality of LED modules 200, as illustrated in FIGS. 12A and 12B, may be provided as a pixel respectively composed of three (3) sub-pixels. In an implementation, each of the LED modules 200 may include three (3) sub-pixels SP1, SP2, and SP3, arranged side by side in one direction. In an implementation, a different number of sub-pixels may be included, and each of the sub-pixels may have a different shape and may have different arrangement.

The LED array PM may not be in an edge region of the circuit board 300. A protective layer 560 surrounding the LED array PM may be in the edge region. The protective layer 560 may include a light blocking material such as a black matrix, or a light reflective material.

Figure 13A:
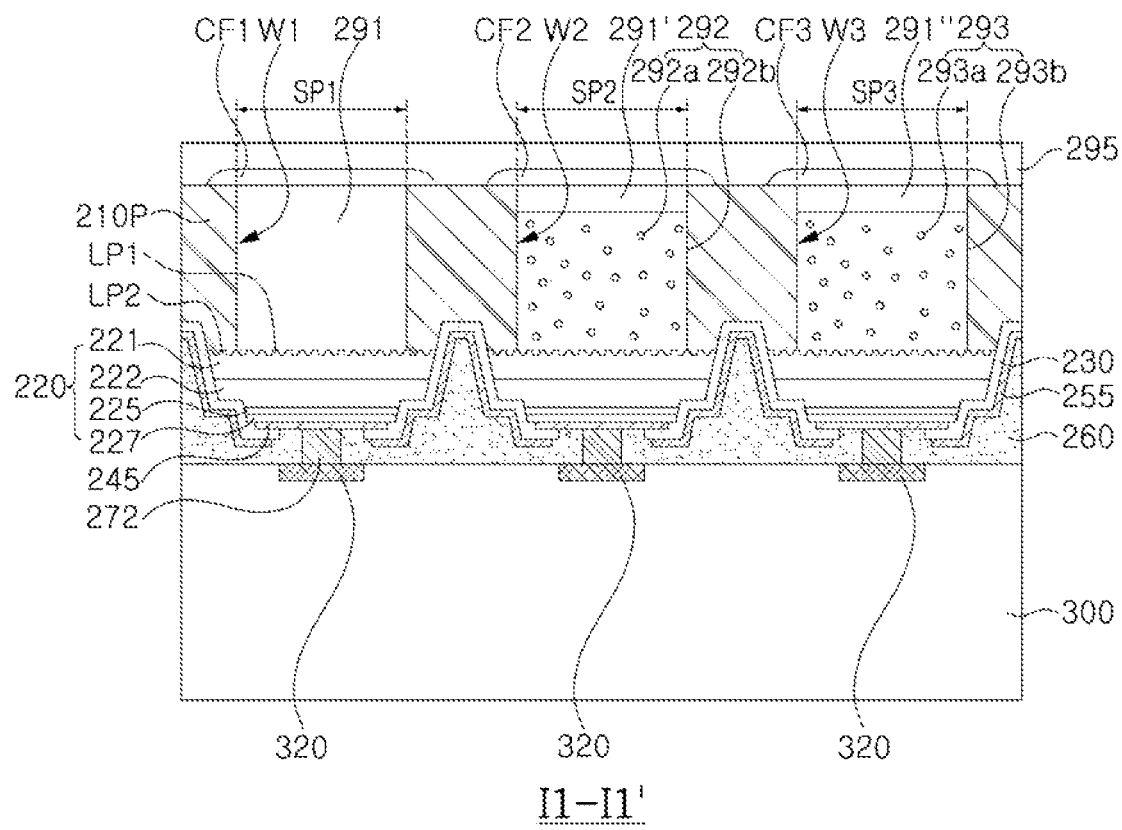
FIGS. 13A to 13C are side cross-sectional views of the semiconductor light emitting device of FIGS. 12A and 12B, taken along lines I1-I1', I2-I2', and I3-I3', respectively.
Figure 13B:
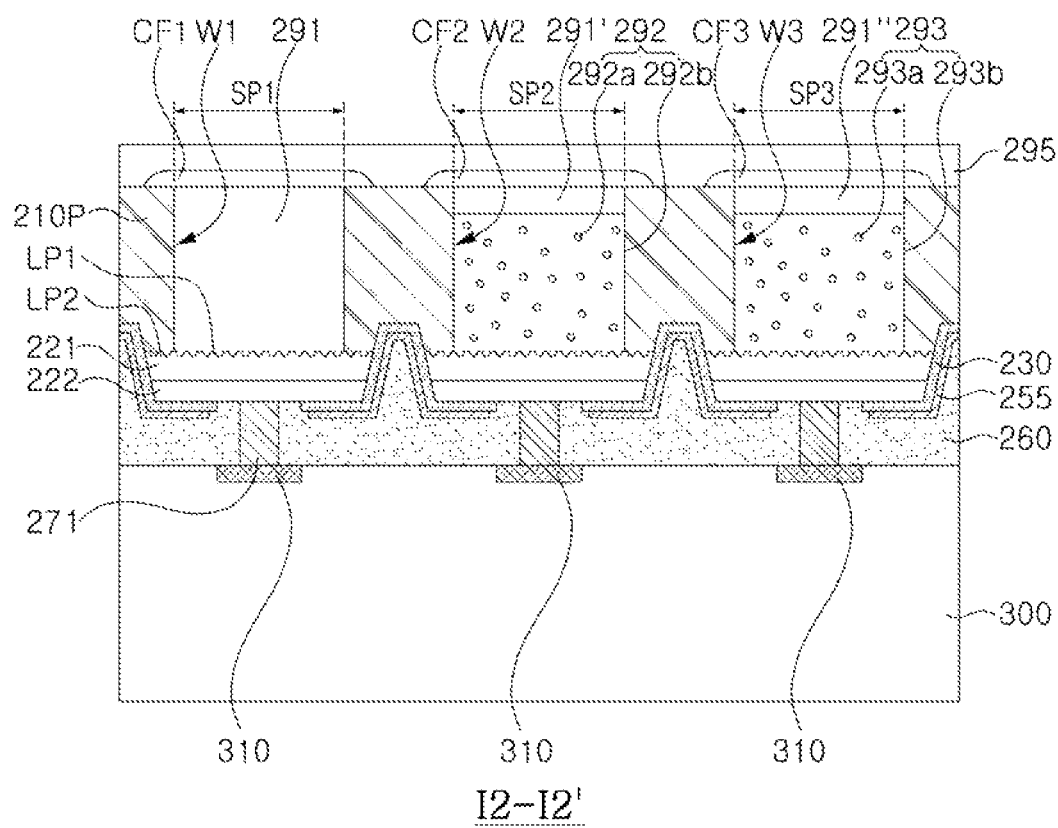
Figure 13C:
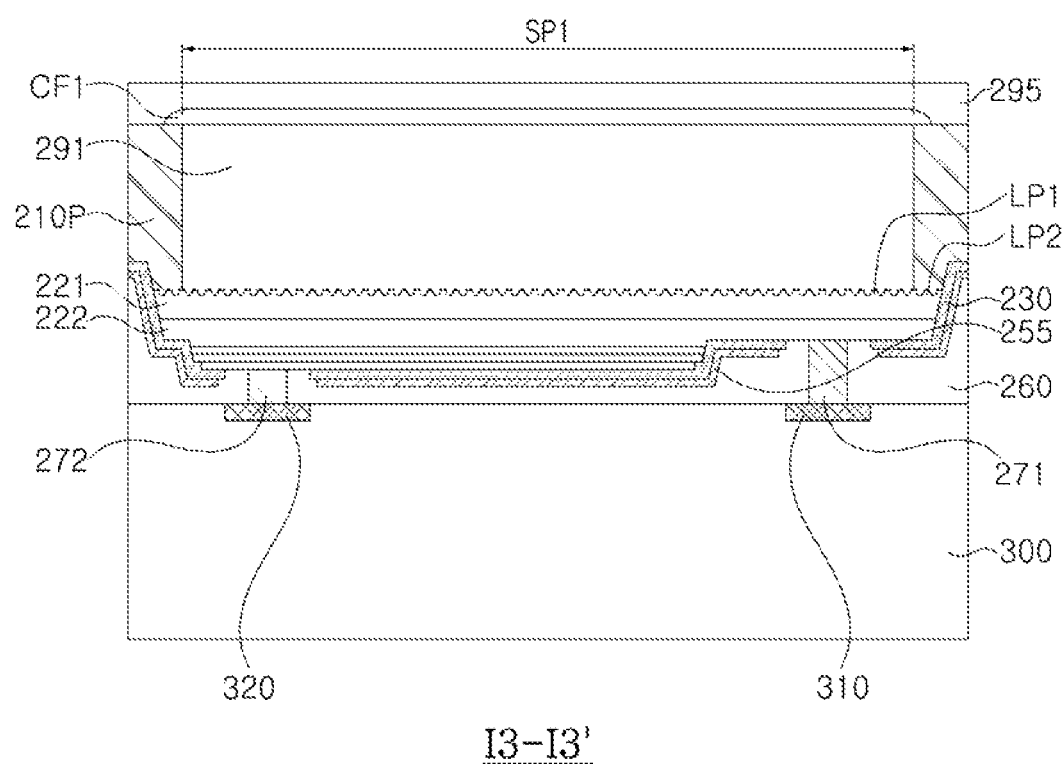

Referring to FIGS. 12A and 12B, each of the plurality of LED modules 10 may include three (3) sub-pixels SP1, SP2, and SP3. FIGS. 13A to 13C are side cross-sectional views of the semiconductor light emitting device of FIGS. 12A and 12B, taken along lines I1-I1', I2-I2', and I3-I3', respectively.

Referring to FIGS. 12A and 12B and FIGS. 13A to 13C, the LED module employed in this embodiment may include first to third sub-pixels SP1, SP2, and SP3 emitting light of different colors. The first to third sub-pixels SP1, SP2, and SP3 may include LED cells C1, C2, and C3 (also referred to as "cell array") respectively having a semiconductor laminate 220 as a light source, respectively.

In this embodiment, the first to third sub-pixels SP1, SP2, and SP3 may be configured to emit light of different colors to display a color image. In an implementation, the first to third sub-pixels SP1, SP2, and SP3 may be configured to emit blue, green, and red light, respectively.

Referring to FIGS. 13A to 13C, the color of light emitted from the first to third sub-pixels SP1, SP2, and SP3 may be determined by the LED cells C1, C2, and C3 and/or the wavelength converters 292 and 293. In this embodiment, the LED cells C1, C2, and C3 may include a semiconductor laminate 220 capable of emitting blue light or ultraviolet light. The semiconductor laminate 220 may include a plurality of epitaxial layers 221, 222, 225, and 227 obtained by the same growth process. The plurality of epitaxial layers 221, 222, 225, and 227 may include an undoped semiconductor layer 221, a first conductivity-type semiconductor layer 222, an active layer 225, and a second conductivity-type semiconductor layer 227, respectively.

Similar to the previous embodiments, the undoped semiconductor layer 221 may include GaN. The first conductivity-type semiconductor layer 222 may include a nitride semiconductor satisfying n-type $In_xAl_yGa_{1-x-y}N$ ($0 \leq x \leq 1$, $0 \leq y < 1$, $0 \leq x+y < 1$), where the n-type impurity may include Si, Ge, Se, or Te. The active layer 225 may have a multiple quantum well (MQW) structure in which a quantum well layer and a quantum barrier layer are alternately stacked with each other. In an implementation, as described above, the active layer 125 may be configured to emit blue light (e.g., 440 nm to 460 nm) or ultraviolet or near ultraviolet light (e.g., 380 nm to 440 nm). The second conductivity-type semiconductor layer 227 may include a nitride semiconductor layer satisfying p-type $In_xAl_yGa_{1-x-y}N$ ($0 \leq x < 1$, $0 \leq y < 1$, $0 \leq x+y < 1$), where the p-type impurity may include Mg, Zn, or Be.

A partition structure 210P on the semiconductor laminate 220 may include first to third windows W1, W2, and W3 at positions corresponding to the first to third LED cells C1, C2, and C3. In an implementation, the first to third windows W1, W2, and W3 may define light emitting regions of each of the sub-pixels, and may be formed in the same shape and size. The partition structure 210P employed in this embodiment may be a remaining portion of a growth substrate for growing the semiconductor laminate 220. In an implementation, the partition structure 210P may include silicon (Si).

Referring to FIGS. 13A and 13B, different wavelength converters 292 and 293 may be in at least a portion of the first to third windows W1, W2, and W3. In an implementation, first and second wavelength converters 292 and 293 may be in the second and third windows W2 and W3, respectively, and may convert the second and third sub-pixels SP2 and SP3 into light of a different color, respectively. In an implementation, the first to third LED cells C1, C2, and C3 may be configured to emit blue light, the first and second wavelength converters 292 and 293 may be configured to convert the emitted blue light into red light and green light, respectively, and a transparent material layer 291 may be in the first window W1 to emit or transmit blue light. In an implementation, the first and second wavelength converters 292 and 293 may include first and second wavelength converting materials 292a and 293a, and transparent resins 292b and 293b in which the first and second wavelength converting materials 292a and 293a are mixed, respectively. The first and second wavelength converting materials 292a and 293a may be phosphors or quantum dots.

The LED module 200 according to this embodiment may include a plurality of patterns LP1 and LP2 entirely arranged on a first surface of the semiconductor laminate 220. The plurality of patterns may include a plurality of first patterns LP1 in a light emitting region of the first surface of the semiconductor laminate 220, e.g., a region corresponding to the window W of the partition structure 210P, and a plurality of second patterns LP2 arranged in a region contacting the partition structure 210P on the first surface 120A. The plurality of first patterns LP1 may have substantially the same shape and may be arranged at a regular interval. The plurality of second patterns LP2 may have substantially the same shape as the shape of the plurality of first patterns LP1, and may be arranged at the same interval as the interval between the plurality of first patterns LP1.

The plurality of first and second patterns LP1 and LP2 may be patterns obtained by transferring from a pattern previously formed on a growth surface of the growth substrate, and the growth surface of the growth substrate may be formed to have a predetermined pattern (referring to FIG. 7A). In an implementation, patterning of the growth substrate may be performed by a texture process using such a photoresist and dry etching. The patterns of the semiconductor laminate 220 obtained by transferring the pattern of the growth substrate may have a uniform pattern, and reproducibility of light efficiency may be greatly improved.

In an implementation, first and second transparent layers 291' and 291" may be on the first and second wavelength converters 292 and 293, respectively, in the second and third windows W2 and W3. The first and second transparent layers 291' and 291" may have substantially the same plane as an upper surface of the partition structure 210P. The transparent material layer 291 may also be formed together with the first and second transparent layers 291' and 291", and may have substantially the same plane as the upper surface of the partition structure 210P. Color filter layers CF1, CF2, and CF3 may be formed on the planar upper surfaces. In an implementation, blue, green, and red color filter layers CF1, CF2, and CF3 may be respectively on the transparent material layer 291 and on the first and second transparent layers 291' and 291", to cover the first to third windows W1, W2, and W3. The first to third color filter layers CF1, CF2, and CF3 may help increase color purity of light emitted from the first to third windows W1, W2, and W3. In addition, a transparent protective layer 295 may be on the partition structure 210P to cover the red, green, and blue color filter layers CF1, CF2, and CF3.

An insulating layer 230 may be on side and partial lower surfaces of the first to third LED cells C1, C2, and C3. In an implementation, the insulating layer 230 may include SiO, SiN, SiCN, SiOC, SiON, or SiOCN. A reflective layer 255 may be on a region of the insulating layer 230 located between the first to third LED cells C1, C2, and C3. The reflective layer 255 may also extend to a region of the insulating layer 230 located on the lower surfaces of the first to third LED cells C1, C2, and C3. The reflective layer 255 may include a reflective metal layer, a distributed Bragg reflective (DBR) layer, or an omni-directional reflective (ODR) layer. In an implementation, the reflective metal layer may include Ag, Ni, or Al. When the reflective layer 255 is a DBR layer, the insulating layer 230 may be omitted.

A filling-insulating portion 260 may be on the protective insulating layer 230 to fill between the first to third LED cells C1, C2, and C3. In an implementation, the filling-insulating portion 260 may cover lower surfaces of the first to third LED cells C1, C2, and C3. In an implementation, the filling-insulating portion 260 may include a silicon oxide insulating material or a silicon oxide-based insulating material. In an implementation, the filling-insulating portion 260 may include tetraethyl ortho silicate (TEOS), undoped silicate glass (USG), phosphosilicate glass (PSG), borosilicate glass (BSG), borophosphosilicate glass (BPSG), fluoride silicate glass (FSG), spin-on-glass (SOG), Tonen Silazene (TOSZ), or a combination thereof.

An ohmic contact 245 may be on the second conductive semiconductor layer 227 of the first to third LED cells C1, C2, and C3. In an implementation, the ohmic contact 245 may include a highly reflective ohmic contact. In an implementation, the ohmic contact 245 may include a material such as Ag, Ni, Al, Cr, Rh, Pd, Ir, Ru, Mg, Zn, Pt, Au, or the like, and may be employed as a single layer or as a structure of two or more layers. In an implementation, the ohmic contact 245 may include a light-transmitting conductive layer such as ITO.

A first electrode 271 connected to the first conductivity-type semiconductor layer 222 may pass through the filling-insulating portion 260 (see FIGS. 13B and 13C). Similarly, a second electrode 272 connected to the second conductivity-type semiconductor layer 227 (e.g., the ohmic contact 245) may pass through the filling-insulating portion 260 (FIGS. 13A and 13C). In an implementation, the first and second electrodes 271 and 272 may include at least one of Cu, Al, Au, Cr, Ni, Ti, or Sn.

By way of summation and review, as the application range of LEDs is expanded to high current and high power fields, improvements in light extraction efficiency and reliability may be considered.

A textured surface in which a plurality of patterns are regularly distributed may be formed on a surface of a growth substrate, and the textured surface may be transferred to a surface of a semiconductor laminate formed on the growth substrate. The textured surface thus obtained may be exposed through a window formed on the growth substrate.

One or more embodiments may provide a semiconductor light emitting device having improved light extraction efficiency and excellent reproducibility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
at least one semiconductor laminate having a first surface and a second surface, opposing each other, the at least one semiconductor laminate including a first conductivity-type semiconductor layer, a second conductivity-type semiconductor layer, and an active layer between the first conductivity-type semiconductor layer and the second conductivity-type semiconductor layer;
a partition structure on the first surface of the at least one semiconductor laminate, the partition structure having a window defining a light emitting region of the first surface of the at least one semiconductor laminate;
a wavelength converter in the window, the wavelength converter being configured to convert a wavelength of light emitted from the active layer; and
at least one first electrode and at least one second electrode on the second surface of the at least one semiconductor laminate and respectively connected to the first conductivity-type semiconductor layer and the second conductivity-type semiconductor layer,
wherein the at least one semiconductor laminate includes:
a plurality of first patterns arranged in the light emitting region of the first surface, and
a plurality of second patterns arranged in a covered region of the first surface contacting the partition structure.

2. The semiconductor light emitting device as claimed in claim 1, wherein the plurality of first patterns have substantially the same shape and are arranged at a regular interval.

3. The semiconductor light emitting device as claimed in claim 2, wherein the plurality of second patterns have shapes that are substantially identical to the shapes of the plurality of first patterns, and are arranged at an interval that is substantially identical to the interval between the plurality of first patterns.

4. The semiconductor light emitting device as claimed in claim 1, wherein the plurality of second patterns are only in a portion of the covered region adjacent to the light emitting region.

5. The semiconductor light emitting device as claimed in claim 1, wherein the plurality of second patterns are in an entirety of the covered region of the first surface contacting the partition structure.

6. The semiconductor light emitting device as claimed in claim 1, wherein:
the plurality of second patterns have substantially the same shape and are arranged at a regular interval, and
the plurality of first patterns are irregularly arranged.

7. The semiconductor light emitting device as claimed in claim 1, wherein each of the plurality of first patterns has a concave structure or a convex structure.

8. The semiconductor light emitting device as claimed in claim 7, wherein a surface of each of the plurality of first patterns has a curved surface.

9. The semiconductor light emitting device as claimed in claim 1, wherein:
the at least one semiconductor laminate further includes an undoped semiconductor layer on the first conductivity-type semiconductor layer, the undoped semiconductor layer having a surface forming the first surface of the at least one semiconductor laminate, and
the plurality of first patterns and the plurality of second patterns are on the surface of the undoped semiconductor layer.

10. The semiconductor light emitting device as claimed in claim 1, wherein:
one region of the first conductivity-type semiconductor layer is exposed by a hole or trench passing through the second conductivity-type semiconductor layer and the active layer,
the semiconductor light emitting device further comprises an insulating layer having a first opening and a second opening, respectively exposing the one region of the first conductivity-type semiconductor layer and one region of the second conductivity-type semiconductor layer, and
the at least one first electrode is connected to the one region of the first conductivity-type semiconductor layer along the first opening, and the at least one second electrode is connected to the one region of the second conductivity-type semiconductor layer along the second opening.

11. The semiconductor light emitting device as claimed in claim 1, wherein:
the at least one semiconductor laminate includes a plurality of semiconductor laminates each provided with a plurality of LED cells, and
the at least one first electrode or the at least one second electrode includes a plurality of electrodes respectively on the plurality of LED cells.

12. The semiconductor light emitting device as claimed in claim 11, further comprising a reflective insulating portion between the plurality of LED cells,
wherein the partition structure is on the reflective insulating portion and has a plurality of windows respectively corresponding to the plurality of LED cells.

13. A semiconductor light emitting device, comprising:
a cell array including a plurality of LED cells, each LED cell respectively having a first conductivity-type semiconductor layer, a second conductivity-type semiconductor layer, and an active layer between the first conductivity-type semiconductor layer and the second conductivity-type semiconductor layer, being separated from each other, and having a first surface and a second surface opposing the first surface;
a reflective insulating portion between the plurality of LED cells such that the plurality of LED cells are optically blocked from each other;
a partition structure on the first surface of the cell array and connected to the reflective insulating portion, the partition structure having a plurality of windows respectively corresponding to the plurality of LED cells;
at least one wavelength conversion layer in at least one window of the plurality of windows, the at least one wavelength conversion layer converting a wavelength of light generated by the active layer; and
a first electrode and a second electrode on the second surface of the cell array and electrically connected to the plurality of LED cells, respectively,
wherein the first surface of the cell array includes:
a plurality of first regions corresponding to the plurality of windows and in which a plurality of first patterns are arranged, and
a second region contacting the partition structure and in which a plurality of second patterns are arranged.

14. The semiconductor light emitting device as claimed in claim 13, wherein the plurality of first patterns and the plurality of second patterns are arranged to have substantially the same regularity.

15. The semiconductor light emitting device as claimed in claim 13, wherein:
the plurality of first patterns are irregularly arranged, and
the plurality of second patterns are arranged to have a predetermined regularity.

16. The semiconductor light emitting device as claimed in claim 13, wherein:
the plurality of LED cells include a first LED cell, a second LED cell, and a third LED cell, and the active layer of each LED cell is configured to emit light of a first wavelength,
the at least one wavelength conversion layer includes a first wavelength conversion layer and a second wavelength conversion layer, respectively on windows on the second LED cell and the third LED cell among the plurality of windows, and
the first wavelength conversion layer is configured to convert light of a first wavelength into light of a second wavelength and the second wavelength conversion layer is configured to convert light of the first wavelength into light of a third wavelength.

17. The semiconductor light emitting device as claimed in claim 13, further comprising at least one color filter layer on the partition structure and covering at least one window among the plurality of windows, the at least one color filter layer being configured to selectively transmit light within a specific band.

18. A semiconductor light emitting device, comprising:
a semiconductor laminate having a first surface and a second surface, opposing each other, the semiconductor laminate including a first conductivity-type semiconductor layer, a second conductivity-type semiconductor layer, and an active layer between the first conductivity-type semiconductor layer and the second conductivity-type semiconductor layer;
a partition structure on the first surface of the semiconductor laminate and having a window defining a light emitting region of the first surface of the semiconductor laminate;
a wavelength converter in the window, the wavelength converter being configured to convert a wavelength of light emitted from the active layer; and
a first electrode and a second electrode on the second surface of the semiconductor laminate and respectively connected to the first conductivity-type semiconductor layer and the second conductivity-type semiconductor layer,
wherein the semiconductor laminate:
has a plurality of light extraction patterns having a substantially uniform shape in the light emitting region of the first surface and arranged at a regular interval.

19. The semiconductor light emitting device as claimed in claim 18, wherein the plurality of light extraction patterns are arranged in a region of the first surface contacting the partition structure.

20. The semiconductor light emitting device as claimed in claim 18, wherein:
the semiconductor laminate further includes an undoped semiconductor layer on the first conductivity-type semiconductor layer, the undoped semiconductor layer having a surface forming the first surface of the semiconductor laminate, and
the plurality of light extraction patterns are on the surface of the undoped semiconductor layer.

\* \* \* \* \*